United States Patent
Ikehashi et al.

(10) Patent No.: US 6,845,047 B2
(45) Date of Patent: *Jan. 18, 2005

(54) READ CIRCUIT OF NONVOLATILE SEMICONDUCTOR MEMORY

(75) Inventors: Tamio Ikehashi, Kamakura (JP); Kenichi Imamiya, Tokyo (JP); Junichiro Noda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/665,019

(22) Filed: Sep. 22, 2003

(65) Prior Publication Data

US 2004/0057326 A1 Mar. 25, 2004

Related U.S. Application Data

(60) Continuation of application No. 10/188,148, filed on Jul. 3, 2002, now Pat. No. 6,674,668, which is a division of application No. 09/745,666, filed on Dec. 26, 2000, now Pat. No. 6,438,038.

(30) Foreign Application Priority Data

Dec. 28, 1999 (JP) .......................................... 11-373069

(51) Int. Cl.[7] .............................................. G11C 11/00
(52) U.S. Cl. .................. 365/189.01; 365/191; 365/196; 365/205; 365/210
(58) Field of Search ............................. 365/189.01, 196, 365/191, 205, 210

(56) References Cited

U.S. PATENT DOCUMENTS

| | | | |
|---|---|---|---|
| 3,996,483 A | 12/1976 | Lombard | |
| 4,725,984 A | 2/1988 | Ip et al. | |
| 5,587,952 A | 12/1996 | Kitsukawa et al. | |
| 5,604,707 A | 2/1997 | Kuge et al. | |
| 5,703,809 A | 12/1997 | Hull et al. | |
| 5,812,456 A | 9/1998 | Hull et al. | |
| 5,864,511 A | 1/1999 | Sato | |
| 5,973,984 A | 10/1999 | Nagaoka | |
| 6,049,500 A | 4/2000 | Kajigaya et al. | |
| 6,072,742 A | 6/2000 | Ooishi | |
| 6,118,699 A | 9/2000 | Tatsumi et al. | |
| 6,166,990 A | 12/2000 | Ooishi et al. | |
| 6,438,038 B2 * | 8/2002 | Ikehashi et al. | 365/185.24 |
| 6,674,668 B2 * | 1/2004 | Ikehashi et al. | 365/185.24 |
| 6,734,719 B2 * | 5/2004 | Tanzawa et al. | 327/541 |
| 2001/0006479 A1 | 7/2001 | Ikehashi et al. | |
| 2002/0027803 A1 | 3/2002 | Matsui | |
| 2002/0196667 A1 | 12/2002 | Ikehashi et al. | |

FOREIGN PATENT DOCUMENTS

| | | |
|---|---|---|
| JP | 40-3154287 A | 7/1991 |
| JP | 40-5325583 A | 12/1993 |
| JP | 2000-090685 A | 3/2000 |
| JP | 2000-149581 | 5/2000 |

OTHER PUBLICATIONS

Raul–Adrian Cernea, et al., "A 1Mb Flash EEPROM", *IEEE ISSCC Dig. Tech. Paper.*, pp. 331–333, 1989.

* cited by examiner

Primary Examiner—Viet Q. Nguyen
(74) Attorney, Agent, or Firm—Banner & Witcoff, Ltd.

(57) ABSTRACT

An INVSRC node and a SAREF node are previously precharged. After a potential on a bit line is reset, the bit line (BLS node) is precharged. In this event, a clamp MOS transistor in a sense amplifier is in ON state, and an SA node is also precharged simultaneously. A precharge level is set to a value lower than a threshold voltage of an inverter. Subsequently, when SAEN transitions to "H," a sense operation is performed. For reading data "0," the SA node is rapidly increased to Vdd. For reading data "1," the SA node slowly approaches to Vss. A change in the potential at the SA node is detected by the inverter.

15 Claims, 16 Drawing Sheets

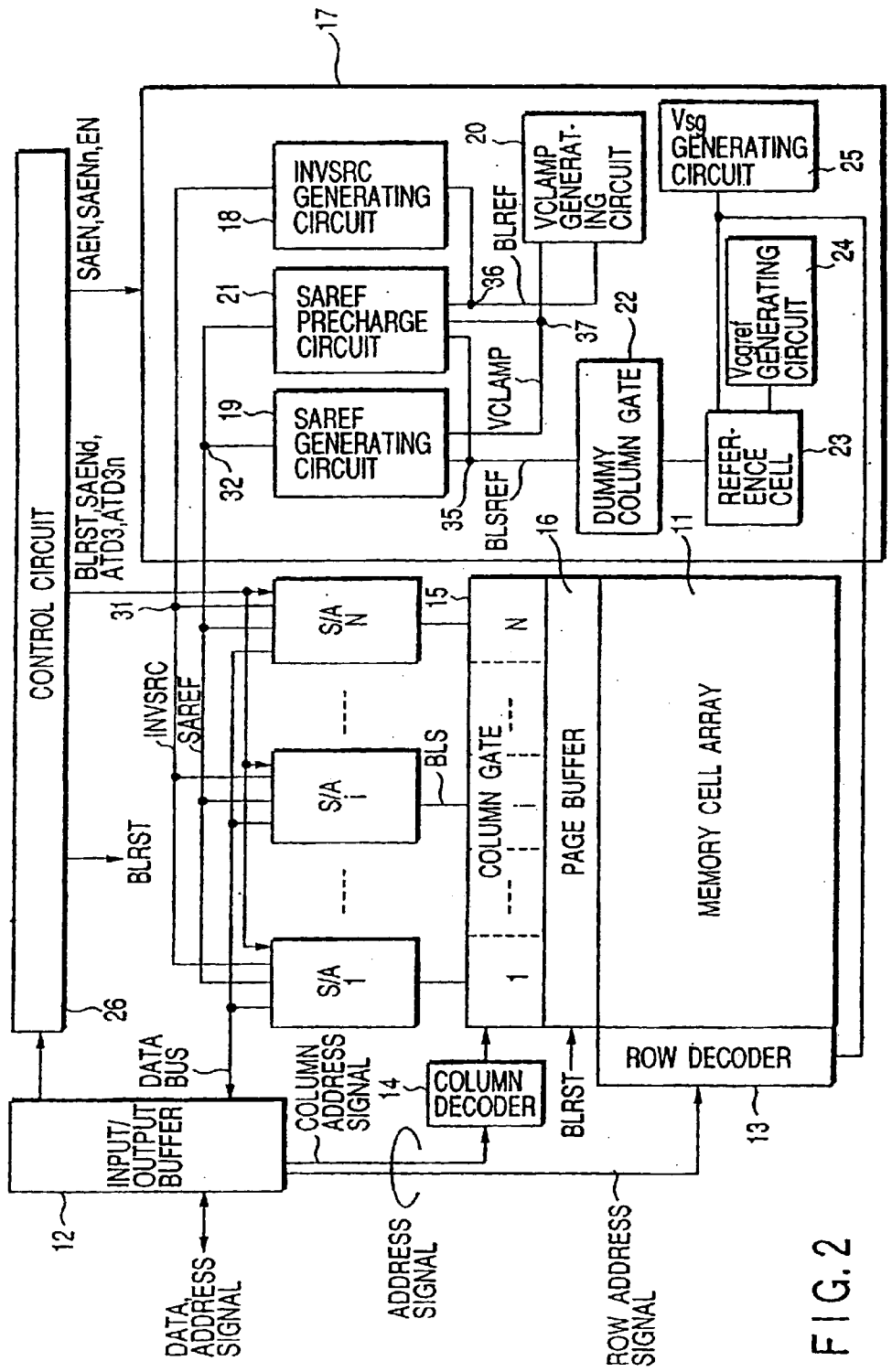
F I G. 2

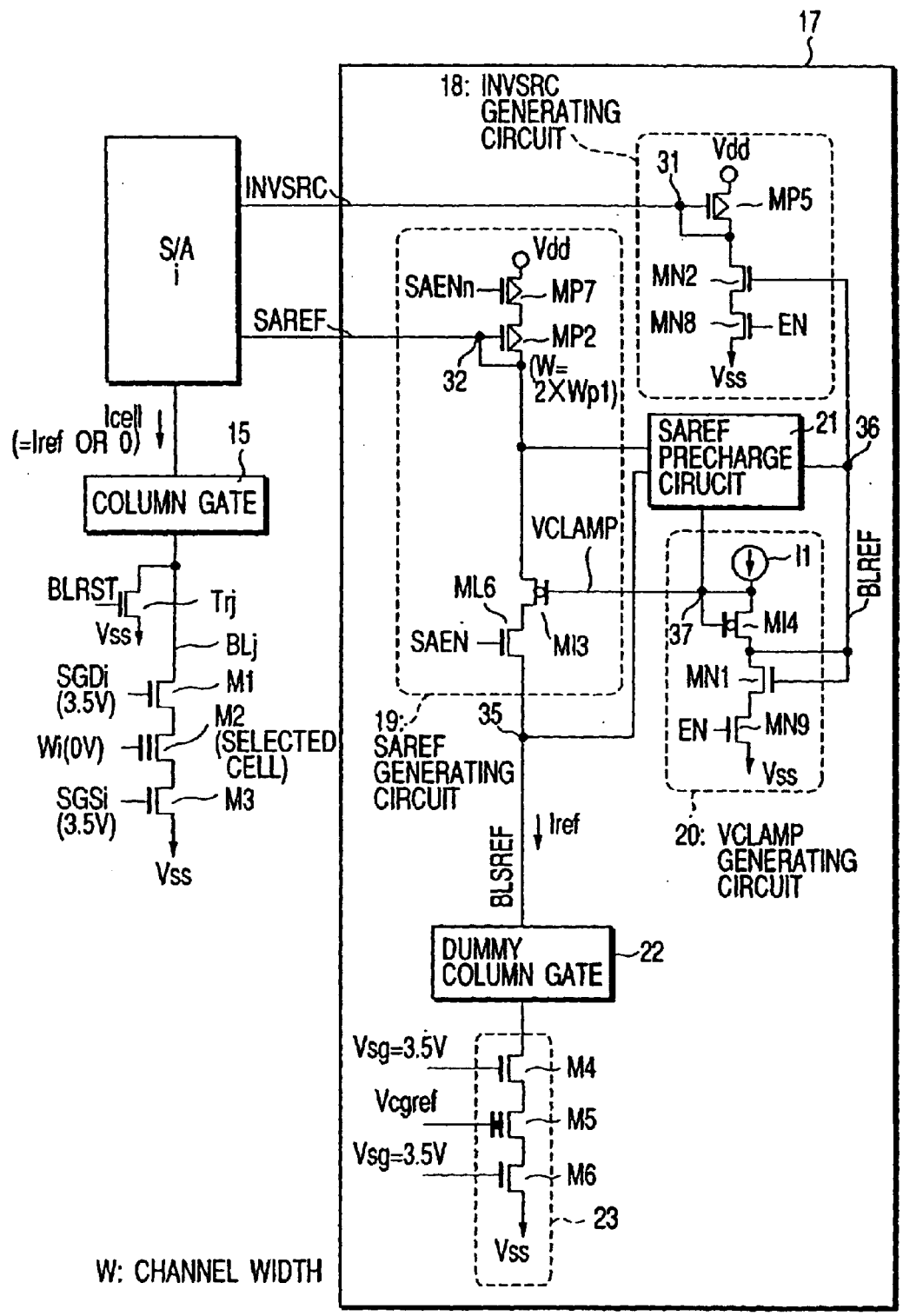
F I G. 7

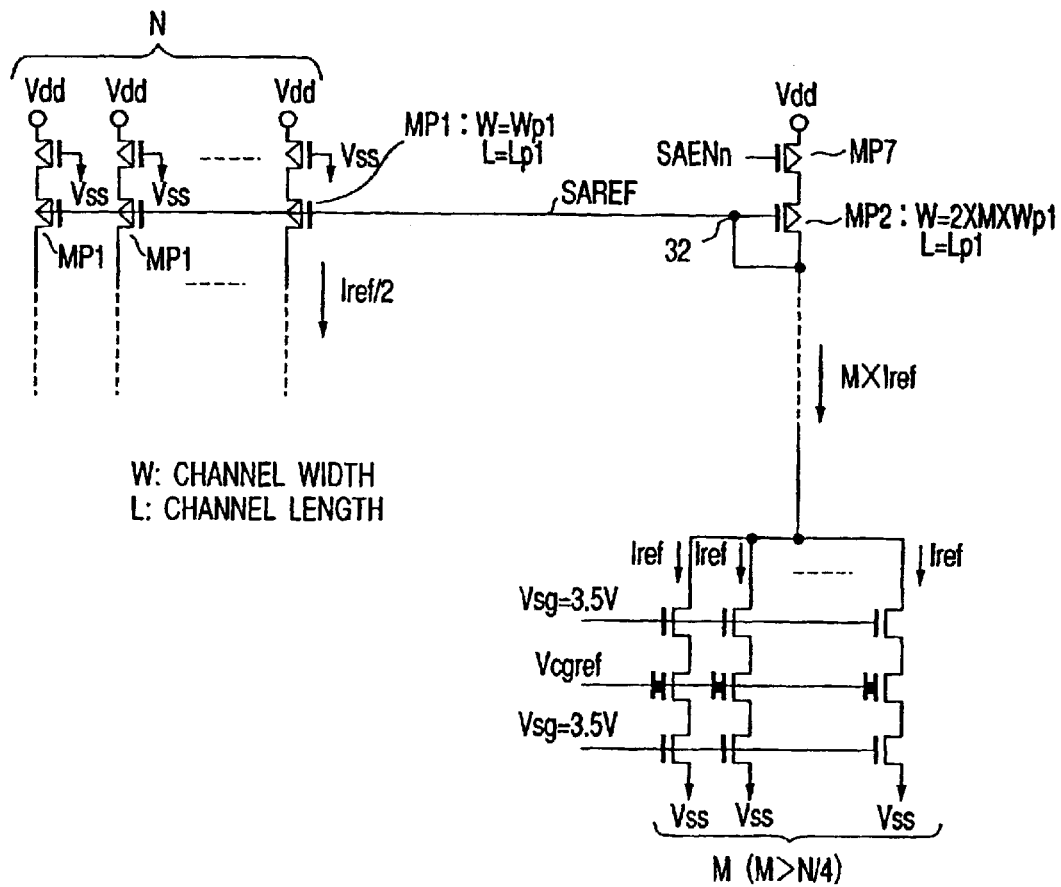
F I G. 8

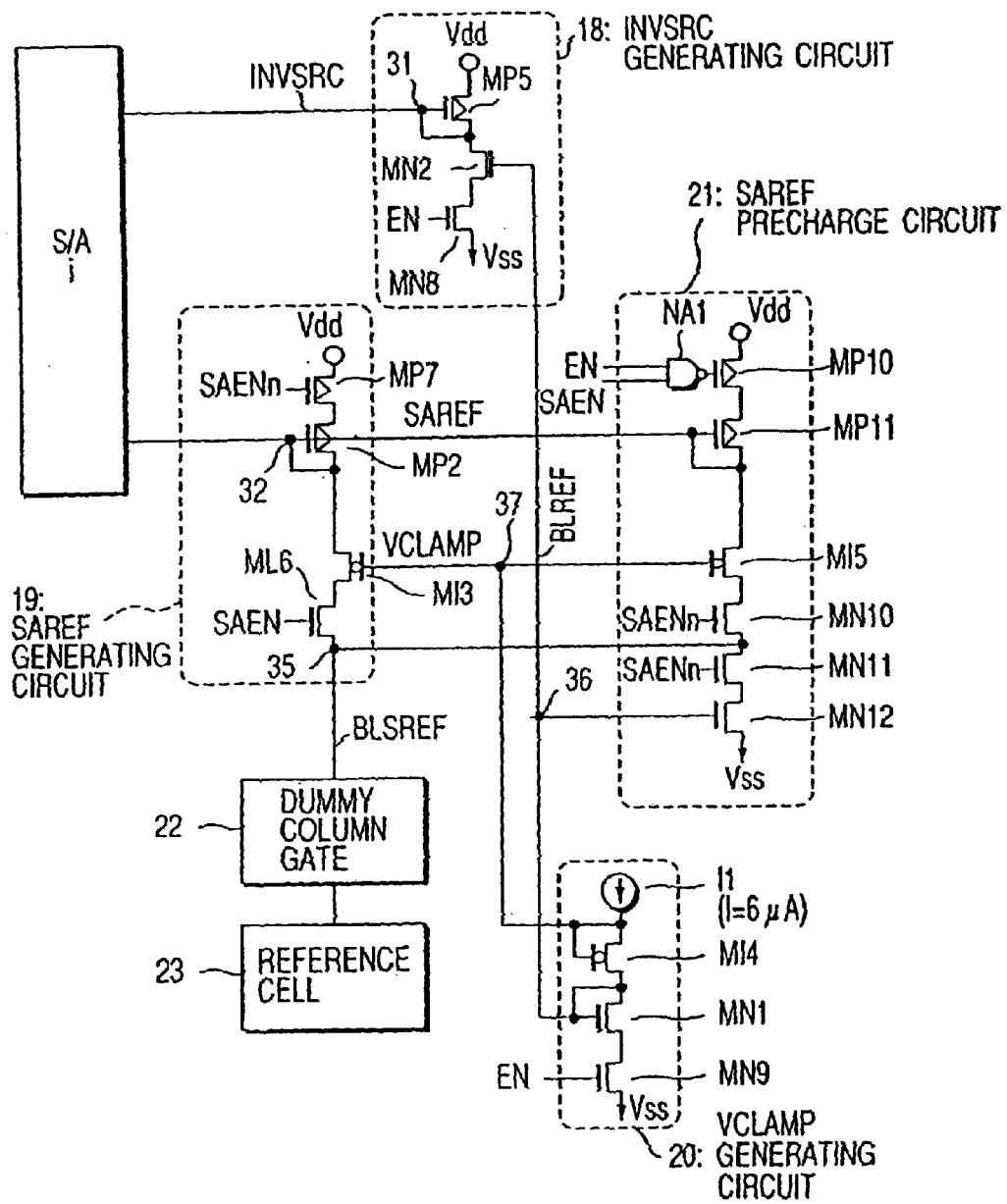
F I G. 11

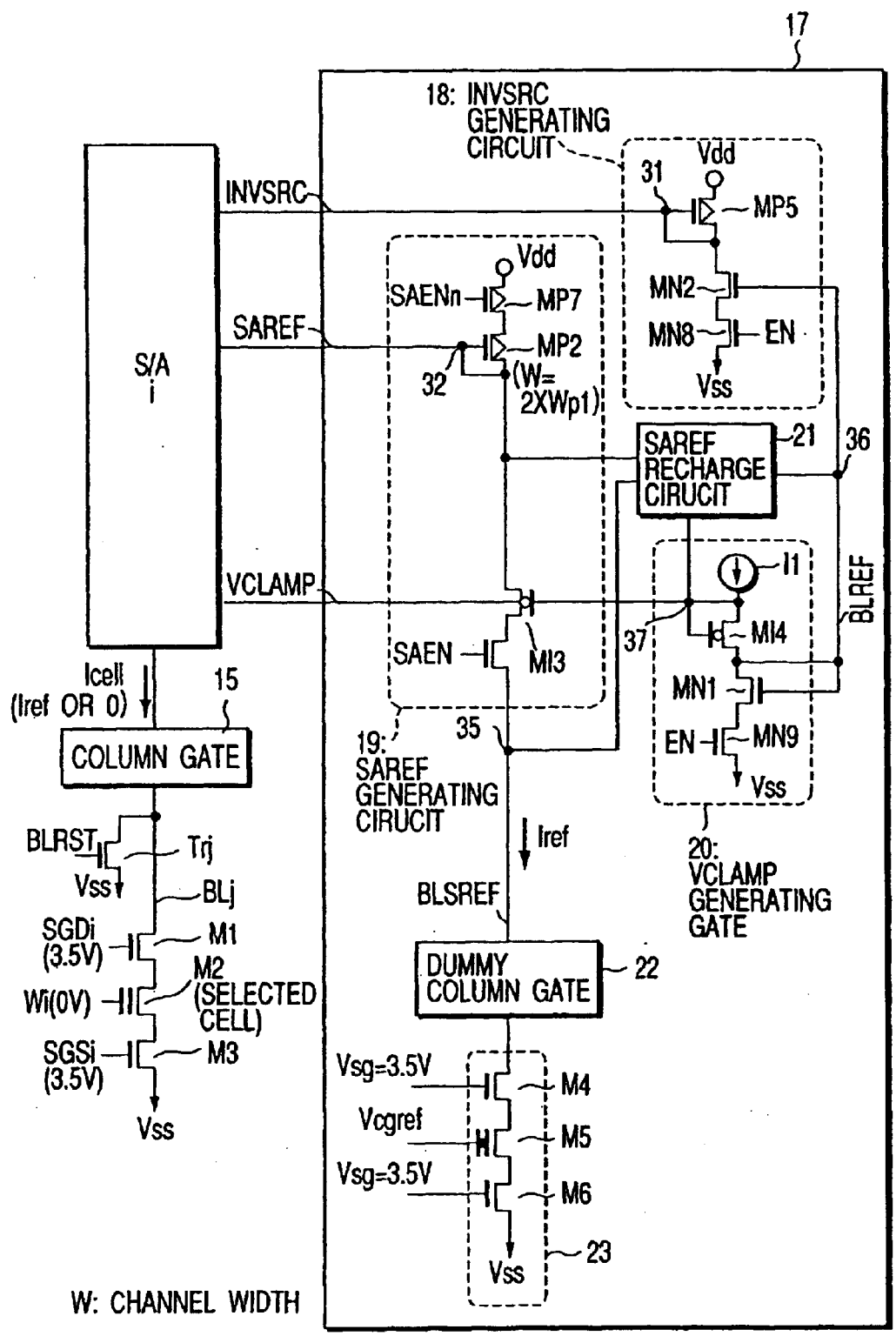
F I G. 17

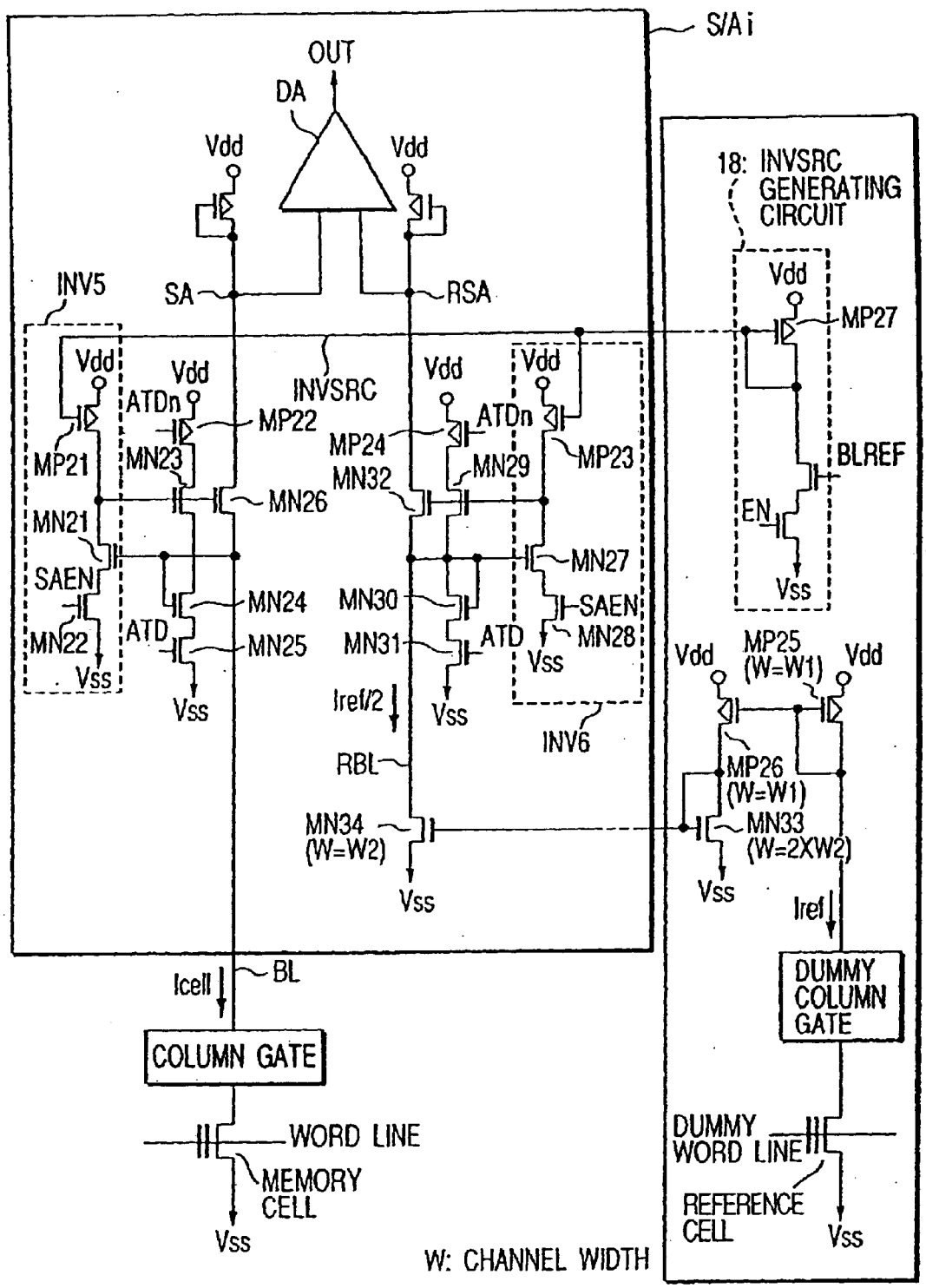
F I G. 19

READ CIRCUIT OF NONVOLATILE SEMICONDUCTOR MEMORY

CROSS-REFERENCE TO RELATED APPLICATIONS

This application is a continuation of prior U.S. application Ser. No. 10/188,148, filed Jul. 3, 2002, now U.S. Pat. No. 6,674,668 which is a divisional of prior U.S. application Ser. No. 09/745,666, filed Dec. 26, 2000, now U.S. Pat. No. 6,438,038 which is based upon and claims the benefit of priority from the prior Japanese Patent Application No. 11-373069, filed Dec. 28, 1999, the entire contents of which are incorporated herein by reference.

BACKGROUND OF THE INVENTION

The present invention relates to a read circuit of a nonvolatile semiconductor memory.

1. Types of Fast Random Accessible Nonvolatile Semiconductor Memories

As fast random accessible nonvolatile semiconductor memories, EEPROM, NOR cell type flash memory, and the like are known. In recent years, new types of memories based on a NAND cell type flash memory have been devised as a memory having a fast random access characteristic in parallel with these memories. One of such memories is a so-called "3Tr-NAND."

The 3Tr-NAND is a memory which has each cell unit composed of three transistors, i.e., one memory cell and two select transistors sandwiching the memory cell, and has the following characteristics as compared with the EEPROM or flash memory:

(1) ability of fast read in units of 16 bits (=word);

(2) a small erasure unit of 32 words;

(3) ability of performing a read operation at low power consumption; and (4) relatively small memory cell size.

Specifically, the 3Tr-NAND is, for example, smaller in memory cell size as compared with the EEPROM, and can therefore accomplish a reduction in chip size, a reduction in manufacturing cost, and the like. Also, the 3Tr-NAND requires lower power consumption and provides a smaller erasure unit as compared with a NOR cell type flash memory (for further details on 3Tr-NAND, see for example Japanese Patent Application No. 11-10676 (filed on Jan. 19, 1999)).

2. Read Circuit of NOR Cell Type Flash Memory

As to an access time upon reading, the 3Tr-NAND is equivalent to the NOR cell type flash memory. Specifically, the two memories require approximately 100 nsec. As such, the following description will be made on a read circuit of a NOR cell type flash memory as a conventional read circuit.

Also, for facilitating the understanding of the following description, definitions are made as follows beforehand about data in a memory cell. Specifically, it is assumed that a memory cell with a positive threshold voltage is a memory cell which stores "0" data (or "0"-programming cell), and a memory cell with a negative threshold voltage is a memory cell which stores "1" data (or "1"-programming cell or a erasure cell).

It should be noted that the threshold voltage of a memory cell, for example, a memory cell of a stacked gate structure having a floating gate electrode, is determined by the quantity of electrons in the floating gate electrode. Also, the quantity of electrons in the floating gate electrode is controlled, for example, by applying an F-N tunnel current to a tunnel insulating film.

2.1. Circuit Configuration

FIG. 1 shows a conventional read circuit of a NOR cell type flash memory.

This read circuit has a so-called double-ended type which compares a current Iref flowing into a reference cell with a current flowing into a selected memory cell to determine data in the memory cell ("1" or "0").

S/Ai indicates one sense amplifier. Generally, a plurality of sense amplifiers are disposed in a memory chip. Also, a plurality of bit lines BL1, . . . , BLn are connected to a single sense amplifier S/Ai through a column gate. Further, a read control signal generating circuit is connected to the sense amplifier S/Ai, and provides a read control signal to the sense amplifier S/Ai upon reading. The read control signal generating circuit includes a reference cell.

Then, upon reading, the cell current Iref of the reference cell is set to be substantially equal to a cell current Icell flowing into a memory cell which stores "1" data ("1"-programming cell). In other words, assuming that the memory cell is identical in structure to the reference cell, the reference cell is set to "1"-programming state (negative threshold voltage state).

As a read potential (ground potential) is provided to a selected word line and a dummy word line, and the cell current Iref flows through the reference cell, a current flowing into an RSA node 33 (RBL) is set to Iref/2 (=Icell/2) by current mirror circuits MR1, MR2. Reference letter W represents the size of a transistor (channel width).

When a selected memory cell stores "1" data (in the case of "1"-programming cell), Icell flows into an SA node 33 (BL), so that the potential at the SA node 33 becomes lower than the potential at the RSA node 33.

On the other hand, when a selected memory cell stores "0" data (in the case of "0"-programming cell), little current flows into the SA node 33 (BL), so that the potential at the SA node 33 becomes higher than the potential at the RSA node 33.

Therefore, data in a selected memory cell ("1" or "0") can be discriminated by detecting a potential difference between the SA node 33 and the RSA node 33 using a differential amplifier DA.

2.2. Consumed Current During Read

In the NOR cell type flash memory, when the read circuit as described above is used, for example, it can be thought that a consumed current during a read mainly consists of the following three currents:

cell current: Icell current produced by the differential amplifier: Iamp current produced in components other than the above: Ielse A majority of Ielse is occupied by a current consumed by an intermediate potential generating circuit required for a read operation.

Consider now that a read is performed in units of 16 bits (=1 word).

In this event, since 16 sets of read circuits are required, a total value Itot of consumed currents during the read is calculated as:

$$I_{tot} = 16 \times \left(\frac{3}{2} I_{cell} + I_{amp}\right) + I_{else}$$

In the equation (1), a factor 3/2 in the first term of the right side is based on the sum of a cell current Icell of a memory cell which stores "1" data ("1"-programming cell) and a cell current Iref/2 of the reference cell (=Icell/2).

For reducing the value Itot, the value Icell or Iamp in the first term of the right side, or the value Ielse in the second term of the right side may be reduced. However, the first term on the right side exerts a larger influence on Itot than the second term on the right side does. For this reason, whatever expedient is adopted for reducing the second term on the right side, i.e., the value Ielse, the resulting effect on the reduction in Itot is not so large.

Therefore, it can be understood that a reduction in the value of the first term on the right side is effective for reducing the value Itot. However, it is quite difficult to reduce the value Icell in the first term on the right side. This is because if Icell is simply reduced alone without changing a method of sensing a potential on a bit line (read data) during a read, a read time is necessarily extended.

Thus, for reducing the value Itot, it is only Iamp that leaves ground for consideration.

However, the value Iamp depends on a time required by a differential amplifier for amplification (=sense time). Specifically, in the read circuit of FIG. 1, for example, a significantly large current need be consumed for amplifying the potential difference between the SA node 33 and the RSA node 33 at a high speed. Assuming that Icell is set to approximately 30 $\mu$A and a sense time to approximately 30 nsec, Iamp is required to be as large as 50 $\mu$A or so.

In other words, since the sense time and the consumed current are in a trade-off relationship in a read operation, the conventional read circuit is disadvantageous in that a faster read operation and lower power consumption cannot be simultaneously accomplished.

As appreciated, the read circuit of the conventional nonvolatile semiconductor memory, for example, a read circuit of a NOR cell type flash memory is disadvantageous in that a faster read operation and lower power consumption cannot be simultaneously accomplished.

Also, for nonvolatile semiconductor memories other than the NOR cell type flash memory, the faster read operation and lower power consumption are critical problems. For example, the read circuit of the NOR cell type flash memory can be applied as it is as a read circuit of the aforementioned 3Tr-NAND. In this case, the faster read operation and lower power consumption must be accomplished in the 3Tr-NAND as well.

Particularly, since the 3Tr-NAND has been developed for use in portable devices with low power consumption such as a non-contact type IC card, the faster read operation and lower power consumption are extremely critical.

BRIEF SUMMARY OF THE INVENTION

The present invention has been made to solve the disadvantages mentioned above, and its object is to provide a novel read circuit for use in a nonvolatile semiconductor memory which is capable of reducing a consumed current and performing a fast read.

The read circuit of a nonvolatile semiconductor memory according to the present invention comprises at least one sense amplifier, and a read control signal generating circuit for supplying a first signal to the at least one sense amplifier. The at least one sense amplifier has a first current path comprised of a first P-channel MOS transistor having a source electrically connected to a first power supply node and a gate applied with the first signal, and a first N-channel MOS transistor for clamping, connected between a drain of the first P-channel MOS transistor and a memory cell and having a gate applied with a second signal. As a feature, the read control signal generating circuit has a second current path comprised of a second P-channel MOS transistor having a gate and a drain connected to the gate of the first P-channel MOS transistor and a source electrically connected to the first power supply node, and a second N-channel MOS transistor connected between the drain of the second P-channel MOS transistor and a reference cell, and having a gate applied with a third signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram generally showing a read circuit according to the present invention;

FIG. 7 is a diagram showing a read control signal generating circuit;

FIG. 8 is a diagram showing a modification of the reference cell unit;

FIG. 11 is a diagram showing a SAREF precharge circuit;

FIG. 17 is a diagram showing a read control signal generating circuit;

FIG. 19 is a diagram showing a read circuit according to the present invention.

DETAILED DESCRIPTION OF THE INVENTION

Figure 1:
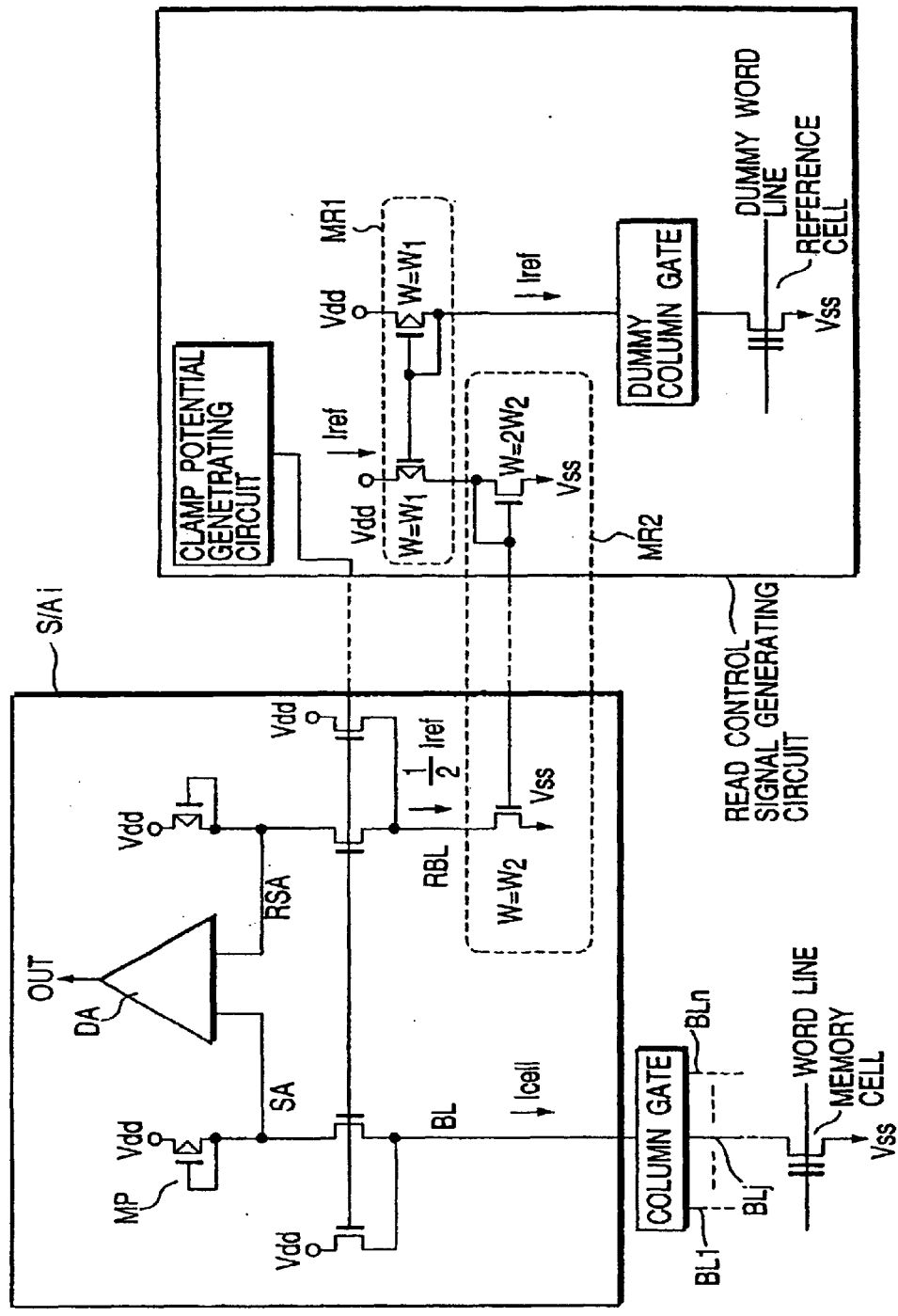
FIG. 1 is a diagram showing a conventional read circuit.

1. A read circuit of a nonvolatile semiconductor memory according to the present invention will hereinafter be described in detail with reference to the drawings.

1.1. General Configuration of Read Circuit

FIG. 2 is a block diagram generally showing a read circuit according to the present invention.

A memory cell array 11 is comprised of a plurality of memory cells arranged in an array form. The present invention is not limited to any particular connection type of memory cells in a memory cell array (for example, a NOR cell type, 3Tr-NAND, and the like), as long as it is a nonvolatile semiconductor memory. However for facilitating the understanding of the description, the following description is made on the assumption that the memory cell array 11 is implemented in the 3Tr-NAND configuration.

A row address signal is input to a row decoder 13 through an input/output buffer 12. The row decoder 13 is disposed, for example, at one end of the memory cell array 11 in a row direction. A column address signal is input to a column decoder 14 through the input/output buffer 12.

A column gate 15 and a page buffer 16 are disposed at one end of the memory cell array 11 in a column direction. An output signal of the column decoder 14 is input to the column gate 15. Memory cells in the memory cell array 11 are connected to sense amplifiers S/A1, ..., S/Ai, ..., S/AN through the page buffer 16 and the column gate 15.

In this embodiment, N sense amplifiers S/A1, ..., S/Ai, ..., S/AN are provided in a memory chip (or a memory macro in the chip). The N sense amplifiers S/A1, ..., S/Ai, ..., S/AN are respectively connected to the input buffer 12 through a data bus. The connections allow N-bit data to be communicated between the input/output buffer 12 and the sense amplifiers S/A1, ..., S/Ai, ..., S/AN.

The value of N is a natural number (1, 2, ...). In other words, a single or a plurality of the sense amplifiers S/Ai may be provided.

One sense amplifier S/Ai is connected to a plurality of bit lines in the memory cell array 11 through the column gate 15 and the page buffer 16. Details on this connection will be described later. One feature of the present invention lies in the circuit configuration of the N sense amplifiers S/A1, ..., S/Ai, ..., S/AN. Details on this aspect will also be described later.

A read control signal generating circuit 17 is connected to the N sense amplifiers S/A1, ..., S/Ai, ..., S/AN. The read control signal generating circuit 17 generates control signals INVSRC, SAREF required for a read operation, and provides the control signals INVSRC, SAREF to the N sense amplifiers S/A1, ..., S/Ai, ..., S/AN.

The read control signal generating circuit 17 includes an INVSRC generating circuit 18, a SAREF generating circuit 19, a VCLAMP generating circuit 20, a SAREF precharge circuit 21, a dummy column gate 22, a reference cell 23, a Vcgref generating circuit 24, and a Vsg generating circuit 25. These circuits will be described later in detail in terms of function, specific example, and operation.

A control circuit 26 generates control signals BLRST, SANDd, ATD3, ATD3n, SAEN, SAENn, EN required for the read circuit of the present invention.

The control signal BLRST is provided to the page buffer 16. The control signals BLRST, SAENd, ATD3, ATD3n are provided to the sense amplifiers S/A1, ..., S/Ai, ..., S/AN. The control signals SAEN, SAENn, EN in turn are provided to the read control signal generating circuit 17. The respective control signals BLRST, SAENd, ATD3, ATD3n, SAEN, SAENn, EN will be described later in detail in terms of their functions and operation timings.

1.2 Configuration of Memory Cell Array

Prior to description on the read circuit according to the present invention, the configuration of the memory cell array will be first described.

Figure 3:
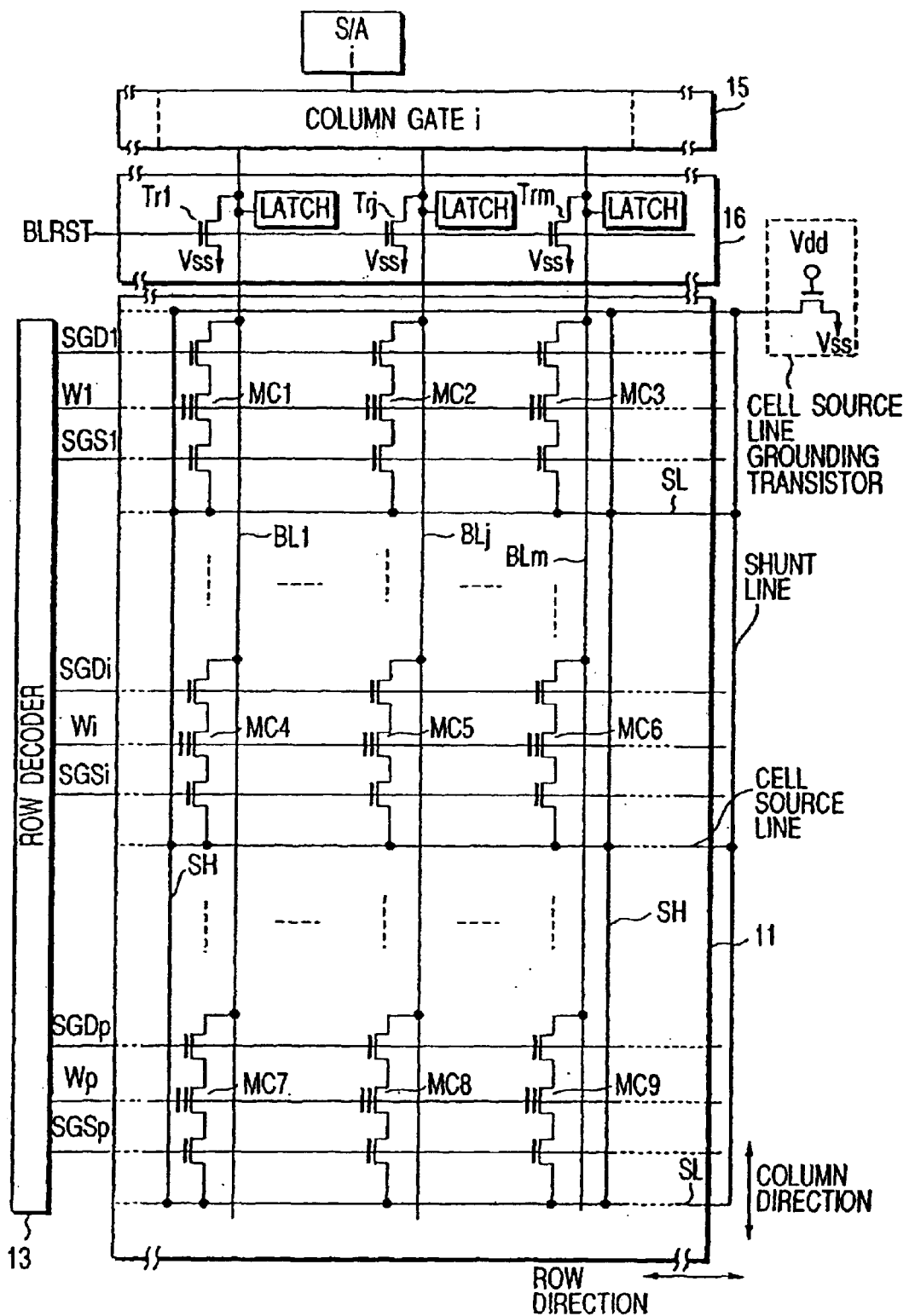
FIG. 3 is a diagram showing an example of a memory cell array.
Figure 4:
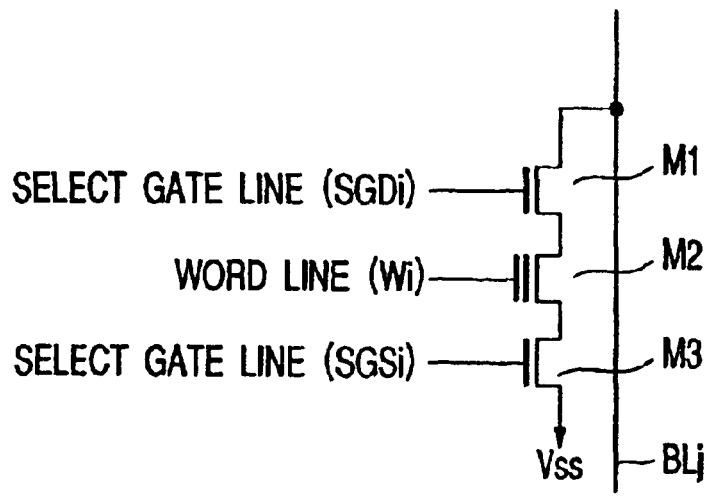
FIG. 4 is a diagram showing a memory cell unit.

FIG. 3 shows an example of a memory cell array. FIG. 4 shows a cell unit forming part of the memory cell array.

Since this embodiment is based on the 3Tr-NAND, respective cell units in the memory cell array 11 are composed of three transistors, i.e., one memory cell M2 and two select transistors M1, M3 which sandwich the memory cell M2 therebetween.

The memory cell M2 has, for example, a stacked gate structure which comprises a floating gate electrode and a control gate electrode. The select transistors M1, M3, which have a structure analogous to the stacked gate structure, for example, function as normal MOS transistors if a lower gate is used as an actual gate electrode.

A cell unit has one end connected to bit lines BL1, ..., BLj, ..., BLm, and the other end connected to cell source lines SL. The bit lines BL1, ..., BLj, ..., BLm are connected to the column gate 15 through the page buffer 16.

The page buffer 16 has latch circuits LATCH, and reset transistors Tr1, ..., Trj, ..., Trm. The latch circuits LATCH are provided corresponding to the bit lines BL1, ..., BLj, ..., BLm. The latch circuits LATCH have a function of temporarily storing program data, for example, in a program operation.

The reset transistors Tr1, ..., Trj, ..., Trm are also provided corresponding to the bit lines BL1, ..., BLj, ..., BLm. The reset transistors Tr1, ..., Trj, ..., Trm have a function of resetting the potentials on the bit lines BL1, ..., BLj, ..., BLm (to a ground potential) based on the control signal BLRST.

The cell source lines SL are connected to a cell source line-grounding transistor through shunt lines SH. The cell source line-grounding transistor has a function of setting the cell source lines SL to the ground potential.

A plurality of the shunt lines SH are routed in the memory cell array 11, and extend in the column direction similarly to the bit lines BL1, ..., BLj, ..., BLm. The shunt lines SH are provided one for every k (for example 32) bit lines, by way of example (m and k may be the same or different).

During a read, all select gate lines SGS1, ..., SGSi, ..., SGSp on the source line side are set to such a potential (for example, approximately 3.5 V) that causes select transistors on the source line side to turn on. Also, within select gate lines SGD1, ..., SGDi, ..., SGDp on the bit line side, a select gate line connected to a cell unit including a selected memory cell is also set to such a potential (for example, approximately 3.5 V) that causes an associated select transistor to turn on.

Also, for example, within the select gate lines SGD1, ..., SGDi, ..., SGDp on the bit line side, select gate lines which are not connected to a cell unit including a selected memory cell are set to such a potential (ground potential) that causes associated select transistors to turn off.

With the 3Tr-NAND configuration, during a read, all word lines W1, ..., Wi, ..., Wp are set to the ground potential (only limited to the case where a memory cell in "0"-programming state has a positive threshold voltage, and a memory cell in "1"-programming state has a negative threshold voltage).

1.3. Configuration of Reference Cell

The present invention employs a method of reading data of a memory cell by comparing a cell current of a selected memory cell with a reference current generated based on a cell current of the reference cell.

Thus, in the following, the reference cell will be described.

Figure 5:
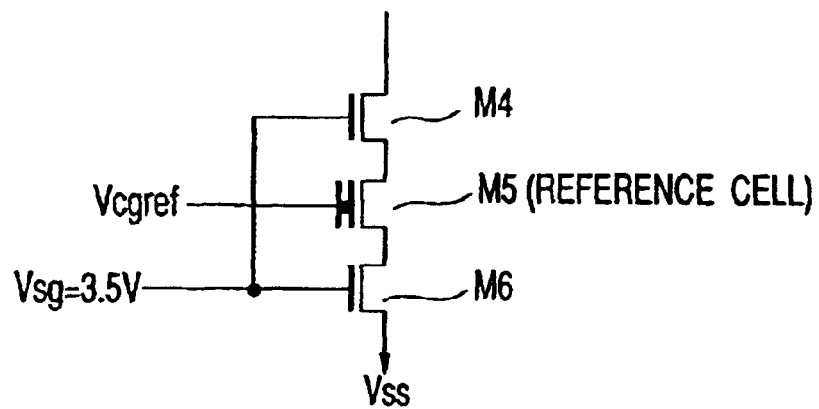
FIG. 5 is a diagram showing a reference cell unit.

FIG. 5 shows a cell unit of a reference cell.

The cell unit of the reference cell, similar to the cell unit (FIG. 4) of a memory cell, is composed of three transistors, i.e., one reference cell M5, and two select transistors M4, M6 which sandwich the reference cell M5 therebetween.

The select transistors M4, M6 are constantly applied at their gates with a potential Vsg (for example, approximately 3.5 V) that causes the select transistors M4, M6 to turn on. In other words, the reference cell M5 is in a selected state at all times.

The reference cell M5 has substantially the same structure as the memory cell M2. The reference cell M5 is characterized in that, unlike the memory cell M2, a floating gate electrode and a control gate electrode are short-circuited to each other.

A control gate potential Vcgref of the reference cell M5 is strictly set such that the reference cell M5 applies a current having substantially the same value as the value of a cell current which flows into a memory cell that stores "1" data ("1"-programming cell).

Specifically, the control gate potential Vcgref is set in the following manner.

First, it is assumed that a threshold voltage of the reference cell M5 is Vtref, and a control gate potential and a threshold voltage of the memory cell M2 are Vcg and Vtcell, respectively. Assume also that a capacitance between the control gate electrode and the floating gate electrode of the memory cell M2 is C1, while a capacitance between the floating gate electrode and the channel of the memory cell M2 is C2.

Here, the following relation is satisfied when a cell current of the memory cell M2 is equal to a cell current of the reference cell M5:

$$V_{cgref} - V_{tref} = \frac{C1}{C1+C2}(V_{cg} - V_{tcell})$$

During a read, Vcg is set to 0 V (ground potential), and the threshold voltage Vtcell of a memory cell which stores "1" data ("1"-programming cell) to approximately −1.5 V. Also, the threshold voltage of the reference cell M5, which has the floating gate electrode short-circuited to the control gate electrode, is uniquely determined, and its value is approximately 0.7 V.

Therefore, assuming that a capacitance ratio C1/(C1+C2) of the memory cell M2 is approximately 0.65, it is understood from the above equation (2) that the control gate potential Vcgref of the reference cell may be set to approximately 1.7 V. The specific configuration of the Vcgref generating circuit for generating the control gate potential Vcgref of the reference cell will be described later in detail.

1.4. Configuration of Read Circuit

In the following, the configuration of the read circuit according to the present invention will be described in detail.

In the following description, definitions are made as follows beforehand about transistors which constitute the read circuit.

Specifically, MPq (q=1, 2, . . . ) designates P-channel MOS transistors, and MLq (q=1, 2, . . . ) and MNq (q=1, 2, . . . ) designate N-channel MOS transistors. Also, MIq (q=1, 2, . . . ) designates N-channel MOS transistors which have lower threshold voltage as compared with the MOS transistors MLq, MNq. In other words, when a potential difference between a gate and a source is 0 V, the MOS transistors MLj and MNj cut off, whereas the MOS transistors MIj do not cut off.

1.4.1. Configuration of Sense Amplifier

Figure 6:
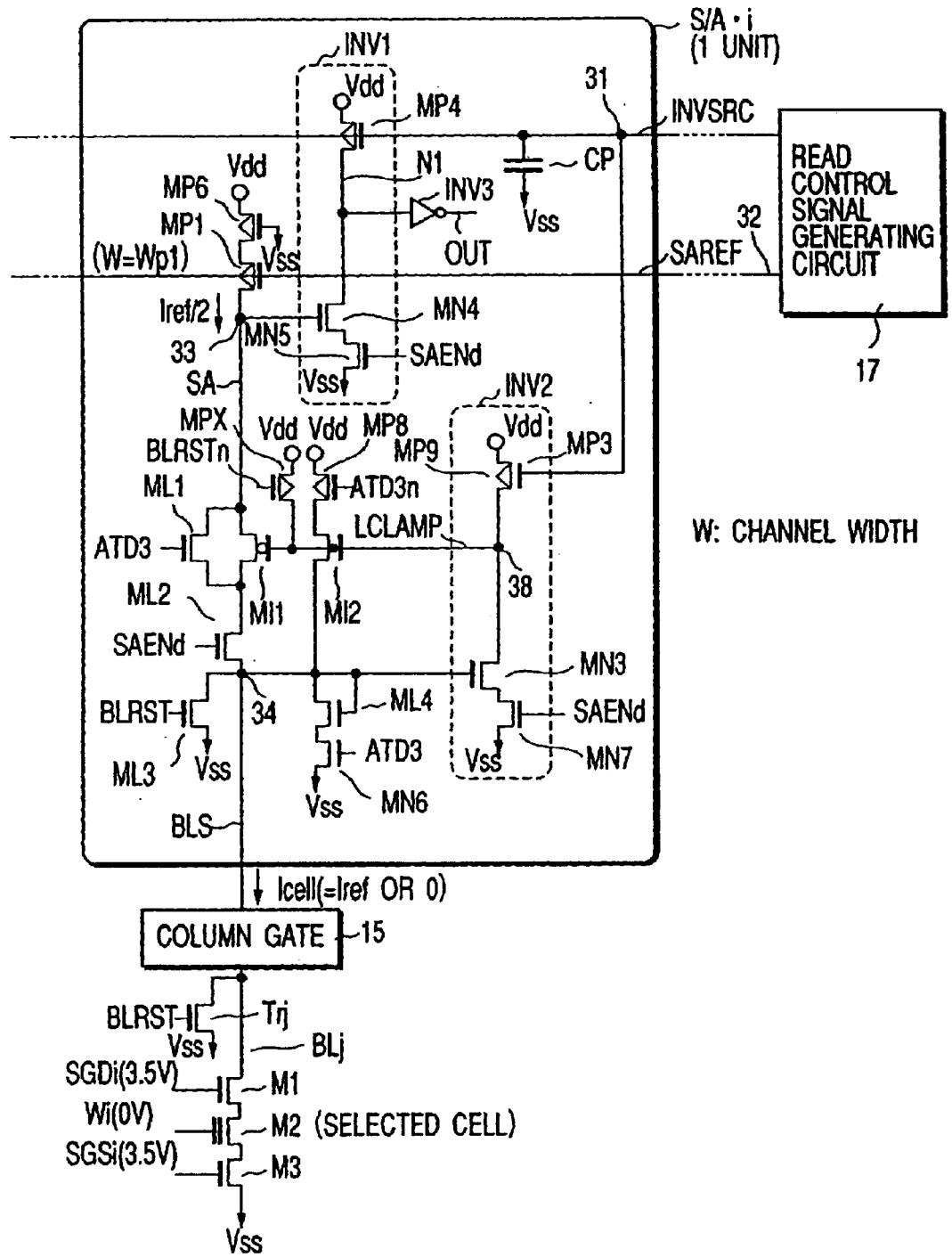
FIG. 6 is a diagram showing a sense amplifier.

FIG. 6 shows the configuration of a sense amplifier (for one unit).

In FIG. 6, "S/Ai" corresponds to "S/Ai" in FIG. 2.

P-channel MOS transistors MP1, MP6 are connected in series between a Vdd node (Vdd is an internal power supply potential generated in a chip, and is different from an external power supply potential Vcc supplied from the outside of the chip) and an SA node 33. The control signal SAREF is input to a gate of the MOS transistor MP1. Also, the MOS transistor MP6 has its gate fixed to the ground potential.

Inverters INV1, INV3 are connected in series between the SA node 33 and an output node OUT. The inverter INV1 is comprised of MOS transistors MP4, MN4, MN5 connected in series between the Vdd node and a Vss Node (Vss is at the ground potential).

The control signal INVSRC is input to a gate of the MOS transistor MP4, while the control signal SAENd is input to a gate of the MOS transistor MN5. Also, the SA node 33 is connected to the gate of the MOS transistor MN4, and an output node N1 of the inverter INV1 is connected to the output node OUT of the sense amplifier S/Ai through the inverter INV3.

MOS transistors MI1, ML2 are connected in series between the SA node 33 and a BLS node 34. The BLS node 34 is connected to the column gate 15. A MOS transistor ML1 is connected in parallel with the MOS transistor MI1. Also, a reset transistor ML3 is connected to the BLS node 34.

The control signal LCLAMP is input to a gate of the MOS transistor MI1; the control signal SAENd is input to a gate of the MOS transistor ML2; the control signal BLRST is input to a gate of the MOS transistor ML3; and the control signal ATD3 is input to a gate of the MOS transistor ML1.

Also, MOS transistors MP8, MI12 are connected in series between the Vdd node and the BLS node 34. The control signal LCLAMP is input to a gate of the MOS transistor MI2, and the control signal ATD3n is input to a gate of the MOS transistor MP8.

Further, MOS transistors ML4, MN6 are connected in series between the BLS node 34 and the Vss node. The MOS transistor ML4 has a gate connected to the BLS node 34. The control signal ATD3 is input to a gate of the MOS transistor MN6.

The control signal LCLAMP is generated by an inverter INV2. The inverter INV2 is comprised of MOS transistors MP3, MN3, MN7 connected in series between the Vdd node and the Vss node. The control signal INVSRC is input to a gate of the MOS transistor MP3, and the control signal SAENd is input to a gate of the MOS transistor MN7. A potential at the BLS node 34 is input to a gate of the MOS transistor MN3.

A P-channel MOS transistor MPX is provided for realizing a fast precharge independent of read history. In other words, this transistor MPX sets the control signal LCLAMP to Vdd upon starting a precharge.

1.4.2 Configuration of Read Control Signal Generating Circuit 1 (About Intermediate Potential Generating Circuit)

FIG. 7 shows the configuration of the read control signal generating circuit.

The read control signal generating circuit 17 includes an intermediate potential generating circuit, a SAREF precharge circuit 21, a dummy column gate 22, and a reference cell 23. The reference cell 23 has been described in Section 1.3. The SAREF precharge circuit 21 and the dummy column gate 22 will be described later, and here, within the respective components constituting the read control signal generating circuit 17, the intermediate potential generating circuit will be described in terms of its specific configuration.

The intermediate potential generating circuit comprises an INVSRC generating circuit 18, a SAREF generating circuit 19, and a VCLAMP generating circuit 20.

<INVSRC Generating Circuit 18>

As shown in FIG. 7, the INVSRC generating circuit 18 is comprised of MOS transistors MP5, MN2, MN8 connected in series between a Vdd node and a Vss node (Vdd is an internal power supply potential generated in a chip, and Vss is the ground potential).

The MOS transistor MP5 has a source connected to the Vdd node, and a gate and a drain connected to each other. A control signal BLREF is input to a gate of the MOS transistor MN2, and the control signal (enable signal) EN is input to a gate of the MOS transistor MN8.

Also, the control signal (intermediate potential) INVSRC supplied to the sense amplifier S/Ai is output from the drain of the MOS transistor MP5.

The MOS transistor MP5 and the MOS transistor MP4 (see FIG. 6) in the sense amplifier S/Ai form a current mirror circuit, and similarly, the MOS transistor MP5 and the MOS transistor MP3 (see FIG. 6) in the sense amplifier S/Ai form a current mirror circuit.

The INVSRC generating circuit 18 outputs the control signal (intermediate potential) INVSRC when it transitions from a sleep state (EN="L") to a standby state (EN="H"). Also, during a read, the INVSRC generating circuit 18 remains in the standby state, and a current (consumed current) always flows into the INVSRC generating circuit 18.

Therefore, for accomplishing a reduction in power consumption during a read, it is necessary to minimize the current (consumed current) flowing into the INVSRC generating circuit 18 (in this respect, the same is true for the VCLAMP generating circuit 20, later described).

However, as the current consumed by the INVSRC generating circuit 18 is reduced for lower power consumption, the control signal (intermediate potential) INVSRC is more susceptible to oscillations due to the influence of gate capacitances of the MOS transistors MP3, MP4 (see FIG. 6) in the sense amplifier S/Ai, and the like. Also, if the control signal (intermediate potential) INVSRC deviates from a predetermined value due to oscillations or the like, a long time is required to return the deviated INVSRC to the original value. In other words, a long time is taken until the control signal INVSRC becomes stable.

As a result, this gives rise to problems such as erroneously read data, a longer read time, and the like.

To solve these problems, in this embodiment, a stabilizing capacitor C1 is connected to a signal line on which the control signal INVSRC is transmitted in the sense amplifier S/Ai (see FIG. 6). The stabilizing capacitor C1 should have a capacitance twice or more the gate capacitance of the MOS transistors MP3, MP4 (see FIG. 6) in the sense amplifier S/Ai.

The stabilizing capacitor C1 thus connected prevents the value of the control signal INVSRC from oscillating, thereby making it possible to perform a normal read operation and prevent an increased read time due to the oscillations of the control signal INVSRC.

<SAREF Generating Circuit>

As shown in FIG. 7, the SAREF generating circuit 19 is comprised of MOS transistors MP2, MP7, MI3, ML6 connected in series between a Vdd node and a Vss node (Vdd is an internal power supply potential generated in a chip, and Vss is the ground potential).

The control signal SAENn is input to a gate of the MOS transistor MP7; the control signal VCLAMP is input to a gate of the MOS transistor MI3; and the control signal SAEN is input to a gate of the MOS transistor ML6. The MOS transistor MP2 has a gate and a drain connected to each other.

Also, the control signal (intermediate potential) SAREF supplied to the sense amplifier S/Ai is output from the drain of the MOS transistor MP2. The MOS transistor MP2 has the drain connected to an output terminal of the SAREF precharge circuit 21, later described.

The MOS transistor MP2 and the MOS transistor MP1 (see FIG. 6) in the sense amplifier S/Ai form a current mirror circuit.

In the SAREF generating circuit 19, like the aforementioned INVSRC generating circuit 18, the control signal (intermediate potential) SAREF must be prevented from oscillating to accomplish a normal read operation in the sense amplifier S/Ai.

To prevent the control signal SAREF from oscillating, a stabilizing capacitor having a capacitance sufficiently larger than a gate capacitance of the MOS transistor MP1 (see FIG. 6) may be connected to a signal line on which the control signal SAREF is transmitted. The stabilizing capacitor thus connected reduces the amplitude of the oscillating control signal SAREF, so that a shorter time is taken until the control signal SAREF is stabilized (until the amplitude is converged).

However, the connection of the stabilizing capacitor to the signal line on which the control signal SAREF is transmitted results in an increased capacitance which is parasitic on the signal line, as a matter of course. This results in a longer time which is taken from a transition of the control signal SAEN to "H" to the SAREF node 32 reaching a predetermined potential, in proportion to an increase in the capacitance. In the SAREF generating circuit 19, since the control signal SAREF is output after the control signal SAEN transitions to "H," a longer time required for the SAREF node 32 to reach the predetermined potential means a longer read time.

For the reason set forth above, no stabilizing capacitor is connected to the signal line on which the control signal SAREF is transmitted. Instead, the oscillations of the control signal SAREF are prevented by enhancing the driving capability of the SAREF generating circuit 19. Specifically, while the absence of the stabilizing capacitor causes a larger amplitude of the oscillating control signal SAREF, the enhanced driving capability of the SAREF generating circuit 19 can reduce a time required to converge the amplitude.

It should be noted that a stabilizing capacitor CP (see FIG. 6) is connected to a signal line on which the control signal INVSRC is transmitted. This is because the INVSRC generating circuit 18 is operative before the control signal SAEN transitions to "H." In other words, a delayed signal due to the stabilizing capacitor CP does not at all cause any problem during a read.

The driving capability of the SAREF generating circuit 19 can be enhanced, for example, by increasing the number of reference cells (cell units) as shown in FIG. 8. Specifically, since the reference cell has, for example, the same structure and the same size as the memory cell, the driving capability of the reference cell can be substantially enhanced by connecting a plurality of reference cells in parallel with each other.

It should be noted that for connecting a plurality of reference cells in parallel, the size of the MOS transistor MP2 must be adjusted in accordance with the number of the reference cells. When the number of reference cells connected in parallel is M, a current flowing through the MOS transistor MP2 is M×Iref, where Iref is a cell current of one reference cell.

Then, the read circuit of this embodiment requires that a current flowing into the MOS transistor MP1 (see FIG. 6) in the sense amplifier S/Ai is set to Iref/2. Specifically, for achieving this requirement, assuming that the channel width and the channel length of the MOS transistor MP1 are Wp1, Lp1, respectively, the channel width W and the channel length of the MOS transistor MP2 may be set, for example, to 2×M×Wp1, Lp1, respectively.

Stated another way, since the MOS transistor MP1 has the channel width set to the channel width of the MOS transistor MP2 multiplied by 1/(2×M), the MOS transistor MP1 is applied with a cell current equal to M×Iref (cell current of MP2) multiplied by 1/(2×M), i.e., Iref/2, derived from the principle of the current mirror circuit.

The number M of reference cells is determined in accordance with the number N of sense amplifiers S/Ai connected to the signal line (SAREF node 32) on which the control signal SAREF is transmitted. In other words, since an increase in the number of sense amplifiers S/Ai connected to the SAREF node 32 causes noise to also increase, the number M of reference cells is accordingly increased as well.

Specifically, the ratio of M to N is determined in the following manner.

Assuming that the gate capacitance of the P-channel MOS transistor MP1 is CMP1, since N sense amplifiers S/Ai are connected to the SAREF node 32, the capacitance of the SAREF node 32 is calculated to be N×CMP1.

Assuming also that the potential at the SAREF node 32 deviates from ΔV by a predetermined value due to the influence of capacitive coupling between the SAREF node 32 and other conductive materials, and this deviation ΔV returns to the original predetermined value in a time (return time) Δt by means of the cell current M×Iref, the following relation is derived based on the charge conservation law:

$$N \times CMP1 \times \Delta V = M \times Iref \times \Delta t$$

Here, the gate capacitance CMP1 is set to approximately 100 fF; and the cell current Iref of the reference cell to approximately 20 μA, by way of example. Also, in this event, the deviation ΔV from the predetermined value (reference value) of the control signal SAREF during a precharge of SAREF is approximately 0.1 V.

It has been found from a simulation that the return time Δt should be approximately 2 nsec or less in order for the deviation ΔV to avoid affecting the sense time in the sense amplifier S/Ai.

Thus, according to the aforementioned relation, a read operation can be accurately performed at a high speed by setting the number of reference cells and the number N of sense amplifiers S/Ai as follows:

$$M \geq N/4$$

<VCLAMP Generating Circuit>

As shown in FIG. 7, the VCLAMP generating circuit 20 is comprised of MOS transistors MI4, MN1, MM9 connected in series between a current source I1 and a Vss node. The control signal (enable signal) EN is input to a gate of the MOS transistor MN9.

The MOS transistor MI4 has a gate and a drain connected to each other (diode connection), and from their connecting point, the control signal (intermediate potential) VCLAMP is output. The connecting point of the gate and the drain of the MOS transistor MI4 is connected to the gate of the MOS transistor MI3 and to the SAREF precharge circuit 21.

Likewise, the MOS transistor MN1 has a gate and a drain connected to each other (diode connection). The MOS transistor MN1 has the drain connected to the gate of the MOS transistor MN2 and to the SAREF precharge circuit 21. The control signal BLREF is output from the drain of the MOS transistor MN1.

The MOS transistors MI3, MI4 form a current mirror circuit, and similarly, the MOS transistors MN1, MN2 form a current mirror circuit.

The VCLAMP generating circuit 20 generates the control signal (intermediate potential) VCLAMP, for example, at approximately 1.3 V by the two MOS transistors MI4, MN1 which are diode-connected to a constant current source I1. Also, the constant current source I1 generates a current of approximately 6 μA which is transmitted to the INVSRC generating circuit 18 and the SAREF precharge circuit 21 through a BLREF node 36.

In other words, the control signal BLREF is supplied to the INVSRC generating circuit 18 and the SAREF precharge circuit 21 as a reference potential.

A specific example of the current source I1 in the VCLAMP generating circuit 20 will be described below.

Figure 9:
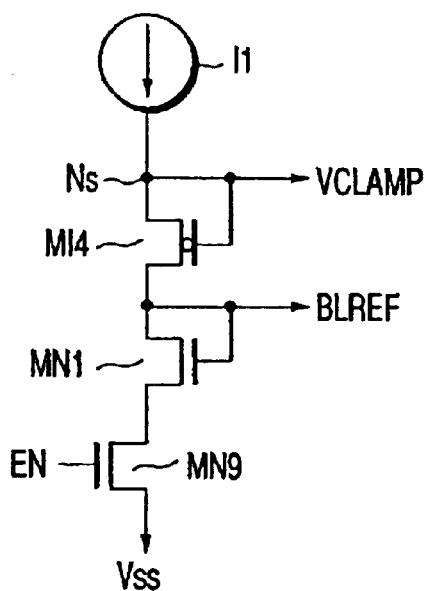
FIG. 9 is a diagram showing a VCLAMP generating circuit.
Figure 10:
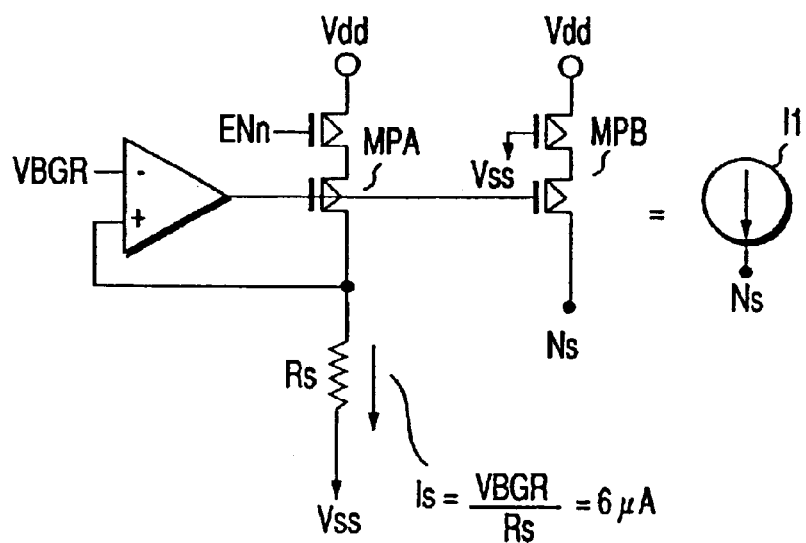
FIG. 10 is a diagram showing a current source in the VCLAMP generating circuit.

FIG. 9 only shows the VCLAMP generating circuit 20 extracted from the read control signal generating circuit 17 of FIG. 7. FIG. 10 shows an example of the current source I1 in the VCLAMP generating circuit 20.

Since MOS transistors MPA, MPB are designed to have the same size, a current Is of approximately 6 μA generated by a resistor Rs and a differential amplifier also flows into a node Ns.

Here, the current value Is can be represented by VBGR/Rs. VBGR is, for example, approximately 1.23 V, the value of which is not temperature dependent. On the other hand, the value of the resistor Rs is generally temperature dependent.

Therefore, the resistor Rs is implemented by a diffusion resistor which has the characteristics that exhibit a smaller resistance at a higher temperature. In this case, the current value Is becomes gradually larger as the temperature rises, whereas the threshold voltages of the N-channel MOS transistors MI4, MN1, MM9 become gradually lower as the temperature rises.

In other words, a deviation of the current value caused by a change in the resistance of the resistor Rs and a deviation of the current value caused by a change in the threshold voltages of the MOS transistors MI4, MN1, MN9 cancel each other, resulting in the elimination of the temperature dependency with respect to the value of the current flowing through the MOS transistors MI4, MN1, MN9.

It is therefore possible to generate the control signals (intermediate potentials) VCLAMP, BLREF which are substantially independent of temperature.

1.4.3. Configuration of Read Control Signal Generating Circuit 2 (about SAREF Precharge Circuit)

FIG. 11 specifically shows the configuration of the SAREF precharge circuit 21 in the read circuit of FIG. 7.

The SAREF precharge circuit 21 is comprised of MOS transistors MP10, MP11, MI5, MN10, MN11, MN12 connected between a Vdd node and a Vss node, and a NAND circuit NA1.

The control signals EN, SAEN are input to the NAND circuit NA1. An output signal of the NAND circuit NA1 in turn is input to a gate of the MOS transistor MP10. The MOS transistor MP11 has a gate and a drain connected to each other. Since the drain of the MOS transistor MP11 is connected to the SAREF node 32, the SAREF node 32 can be precharged by the SAREF precharge circuit.

The MOS transistor MI5 has a gate connected to the gate and the drain of the MOS transistor MI4 in the VCLAMP generating circuit 20. In other words, the MOS transistors MI4, MI5 form a current mirror circuit. The control signal VCLAMP is input to the gate of the MOS transistor MI5.

The control signal SAENn is input to the gates of the MOS transistors MN10, MN11. A connecting point of the MOS transistors MN10, MN11 is connected to a BLSREF node 35. Also, the control signal BLREF is input to a gate of the MOS transistor MN12.

1.4.4 Configuration of Read Control Signal Generating Circuit 3 (About Vcgref Generating Circuit)

Figure 12:
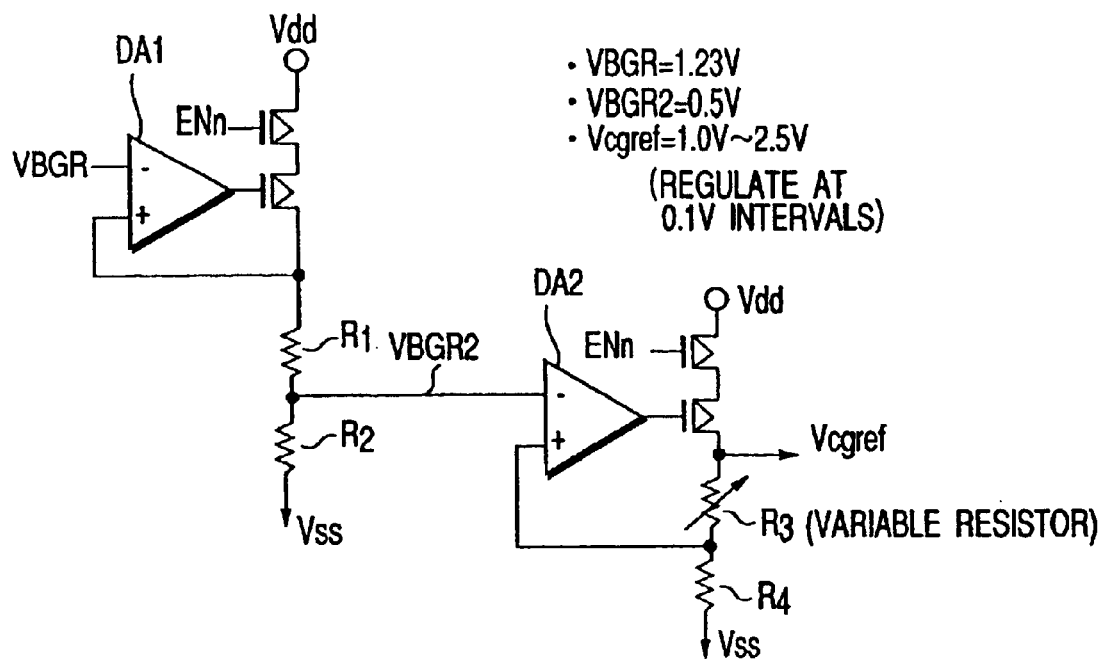
FIG. 12 is a diagram showing a Vcgref generating circuit.
Figure 13:
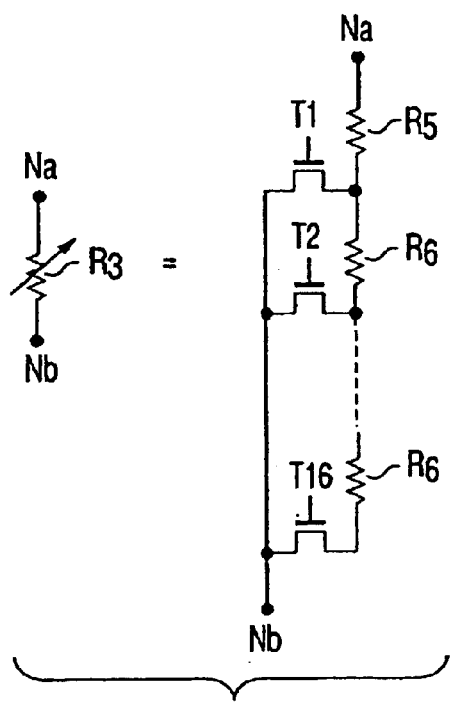
FIG. 13 is a diagram showing a variable resistor in the Vcgref generating circuit.

FIG. 12 shows the configuration of the Vcgref generating circuit. FIG. 13 shows a specific example of a variable resistor R3 in FIG. 12.

The Vcgref generating circuit shown in FIGS. 12 and 13 corresponds to the Vcgref generating circuit 24 in the read control signal generating circuit 17 shown in FIG. 2.

While the control gate potential Vcgref of the reference cell is set to be, for example, approximately 1.7 V, the threshold voltage of the reference cell and the coupling ratio largely depend on wafer process conditions, so that it is quite difficult to precisely estimate these values beforehand. Also, in a test mode (later described) involved in a measurement of a threshold voltage distribution for a memory cell, the value of the output signal Vcgref of the Vcgref generating circuit must be changed.

Therefore, the Vcgref generating circuit must be configured such that its output potential Vcgref can be freely changed. For example, the Vcgref generating circuit is configured such that the output potential Vcgref thereof can be changed from 1.0 V to 2.5 V in increments of 0.1 V.

Also, if the control gate potential Vcgref is temperature dependent, a cell current flowing into the reference cell is also temperature dependent to hinder a correct read, thereby presenting a grave problem. To solve this problem, an output potential VBGR of a temperature independent BGR (Band Gap Reference) circuit is used to generate the control gate potential Vcgref.

However, the output potential VBGR (for example, approximately 1.23 V) of the BGR circuit is at a potential between 1.0 V and 2.5 V, so that if this potential is used as it is, it is difficult to change the output potential Vcgref of the Vcgref generating circuit exactly in increments of 0.1 V.

Thus, in this example, the Vcgref generating circuit is comprised of two differential amplifiers DA1, DA2 such that the output potential Vcgref can be changed exactly in increments of 0.1 V.

First, the first differential amplifier DA1 is used to convert VBGR (=approximately 1.23 V) to a potential out of the range from 1.0 V to 2.5 V, for example, to 0.5 V. Then, the second differential amplifier DA2 is used to generate Vcgref based on the converted reference potential (0.5 V).

In this way, the output potential Vcgref can be changed exactly in increments of 0.1 V.

The output potential Vcgref can be changed by varying the resistance of the variable resistor shown in FIG. 13.

1.4.5. Configuration of Read Control Signal Generating Circuit 4

Section 1.4.1. through Section 1.4.4 have described the configuration of the main components of the read control signal generating circuit.

The components constituting the read control signal generating circuit, which have not been described, are two: the dummy column gate and the Vsg generating circuit. In the following, these two components will be described in brief.

The dummy column gate is provided for making a current path on the memory cell side substantially equal to a current path on the reference cell side (the resistances of the current paths are made substantially identical). Specifically, on the memory cell side, a column gate 15 comprised of a MOS transistor is connected between a bit line BLj and the BLS node 34, for example, as shown in FIG. 6.

As such, the reference cell side is also provided with a dummy column gate 22 which is comprised of at least one MOS transistor that remains in ON state at all times, for example, as shown in FIG. 7. The dummy column gate 22 differs from a column gate comprised of a MOS transistor which is controlled ON/OFF by an output signal of a column decoder in that the former is comprised of the MOS transistor which remains in ON state at all times.

The Vsg generating circuit 25 (see FIG. 2) generates a potential Vsg applied to the gates of the select transistors M1, M3 (see FIGS. 4 and 6) in the cell unit on the memory cell side. During a read, Vsg is at approximately 3.5 V. In this embodiment, the output signal Vsg of the Vsg generating circuit is also applied to the gates of the select transistors M5, M6 (see FIGS. 6 and 7) in the cell unit on the reference cell side.

The Vsg generating circuit may be comprised, for example, of a booster circuit or a boost potential control circuit.

2. Operation of Read Circuit

In the following, description will be made on the operation of the read circuit according to the present invention which has been described in connection with FIGS. 2 through 13.

2.1. Outline of Operation

First, the operation of the read circuit according to the present invention will be outlined with reference to FIGS. 6 and 7. A main portion of the read circuit according to the present invention comprises a first path originating from the Vdd node and reaching the Vss node through the P-channel MOS transistor MP1 and the memory cell units M1, M2, M3; a second path originating from the Vdd node and reaching the Vss node through the P-channel MOS transistor MP2 and the reference cell units M4, M5, M6; and the SAREF node 32 which connects the gates of the two MOS transistors MP1, MP2 to each other.

For facilitating the description, assume that the respective control signals for use in a read operation are set to the following values.

EN, SAEN, SAENd are respectively set to "H" while ATD3, BLRST are set to "L." SAENn, ATD3n are inverted versions of SAEN, ATD3, respectively. SGD, SGS are both at 3.5 V.

In a read operation under these conditions, a reference current Iref flows over the second path. Here, as described above, the value of the current Iref flowing into the reference cell unit is substantially equal to the cell current Icell of a memory cell which stores "1" data.

Since the two MOS transistors MP1, MP2 form a current mirror circuit, the value of the current flowing over the first path can be adjusted by coordinating the ratio of these MOS transistors MP1, MP2 in size (channel width W). In other words, in the present invention, the ratio of the MOS transistors MP1, MP2 in size is determined such that the MOS transistor MP1 applies a current of Iref/2.

Then, the potential at the SA node 33, which is a connecting point of the MOS transistor MP1 and the MOS transistor MI1, is determined by data in the memory cell M2, i.e., whether or not the cell current Icell flows into the memory cell M2 during a read.

For example, when the memory cell M2 stores "1" data, a read potential (0 V) applied to a control gate electrode (selected word line) Wi of the memory cell M2 causes the memory cell M2 to turn on, resulting in the cell current Icell flowing into the memory cell M2.

Also, since Icell=Iref is satisfied as described above, the current Icell (=Iref) drawn by the memory cell M2 from the SA node 33 is larger than the current Iref/2 supplied by the MOS transistor MP1 to the SA node 33, with the result that the potential at the SA node 33 is reduced to 1 V or less.

On the other hand, when the memory cell M2 stores "0" data, the read potential (0 V) applied to the control gate electrode (selected word line) Wi of the memory cell M2 causes the memory cell M2 to turn off, so that the cell current Icell does not flow into the memory cell M2.

In this event, the SA node 33 is only supplied with a current from the MOS transistor MP1, with the result that the potential at the SA node 33 is increased to Vdd.

Therefore, the data in the memory cell M2 can be identified by sensing a change in the potential at the SA node 33 by the inverter INV1.

Notably, in the present invention, no differential amplifiers are used in the sense amplifier (for one unit) S/Ai. This can reduce the current consumed by the read circuit of the present invention to an extremely small value, as compared with the current consumed by the conventional read circuit (FIG. 1).

The read circuit according to the present invention does not require the provision of differential amplifiers in the sense amplifier S/Ai because a potential difference (or amplitude) between the potential at the SA node 33 when "1" data is read and the potential at the SA node 33 when "0" data is read is as large as approximately [Vdd−1 V] (Vdd is, for example, 2.5 V or more and 3.5 V or less). In other words, the potential at the SA node 33 can be input to the inverter INV1 as it is to sense the data in the memory cell M2.

Also, the read circuit according to the present invention can accomplish a reduction in power consumption without degrading the read speed since the read speed is as high as that of the conventional read circuit (FIG. 1), however large the amplitude at the SA node 33 is. In this way, the read speed is not degraded in the present invention because the SA node 33 is disconnected from the bit line and accordingly its capacitance is extremely small, thereby reducing the time required for changing the potential at the SA node 33 in accordance with the data in the memory cell M2.

2.2. Operation Timing

In the following, the operation of the read circuit according to the present invention will be described in detail with reference to timing charts of FIGS. 14 and 15.

Figure 14:
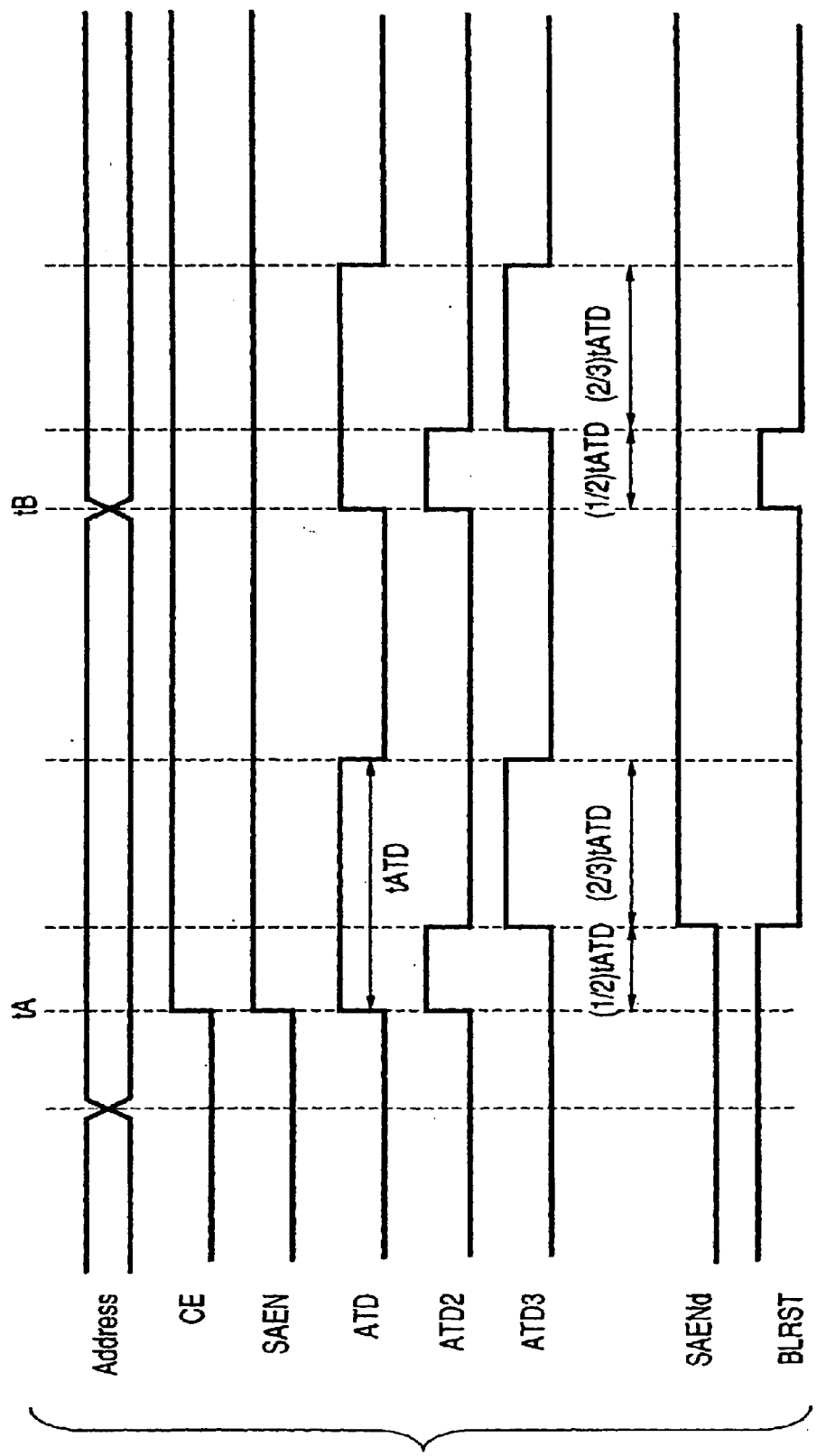
FIG. 14 is a waveform chart showing operation timings of the read circuit according to the present invention.

FIG. 14 shows timings of control signals input from the outside of the chip, and control signals generated inside the chip.

The control signals input from the outside of the chip include an address signal Address and a chip enable signal CE.

As the chip enable signal CE transitions to "H," data is read from a memory cell identified by the address signal Address at this time. When the address signal Address changes during an "H" period of the chip enable signal CE, data is read from a memory cell identified by the new address signal Address after the change.

During a read operation, as the chip enable signal CE transitions to "H," the sense amplifier enable signal SAEN also transitions to "H," and an ATD pulse is generated by an address transition detector. The duration (tATD) of the ATD pulse is approximately 30 ns (from time tA).

The ATD pulse is also generated (at time tB) when the address signal Address changes while the chip enable signal CE is at "H."

Also, in an "H" period of ATD, ATD2 is at "H" for the first one-third period, and ATD3 is at "H" for the last two-third period. Then, SAENd and BLRST are generated at timings as shown in FIG. 14 based on SAEN, ATD, ATD2 and ATD3.

Figure 15:
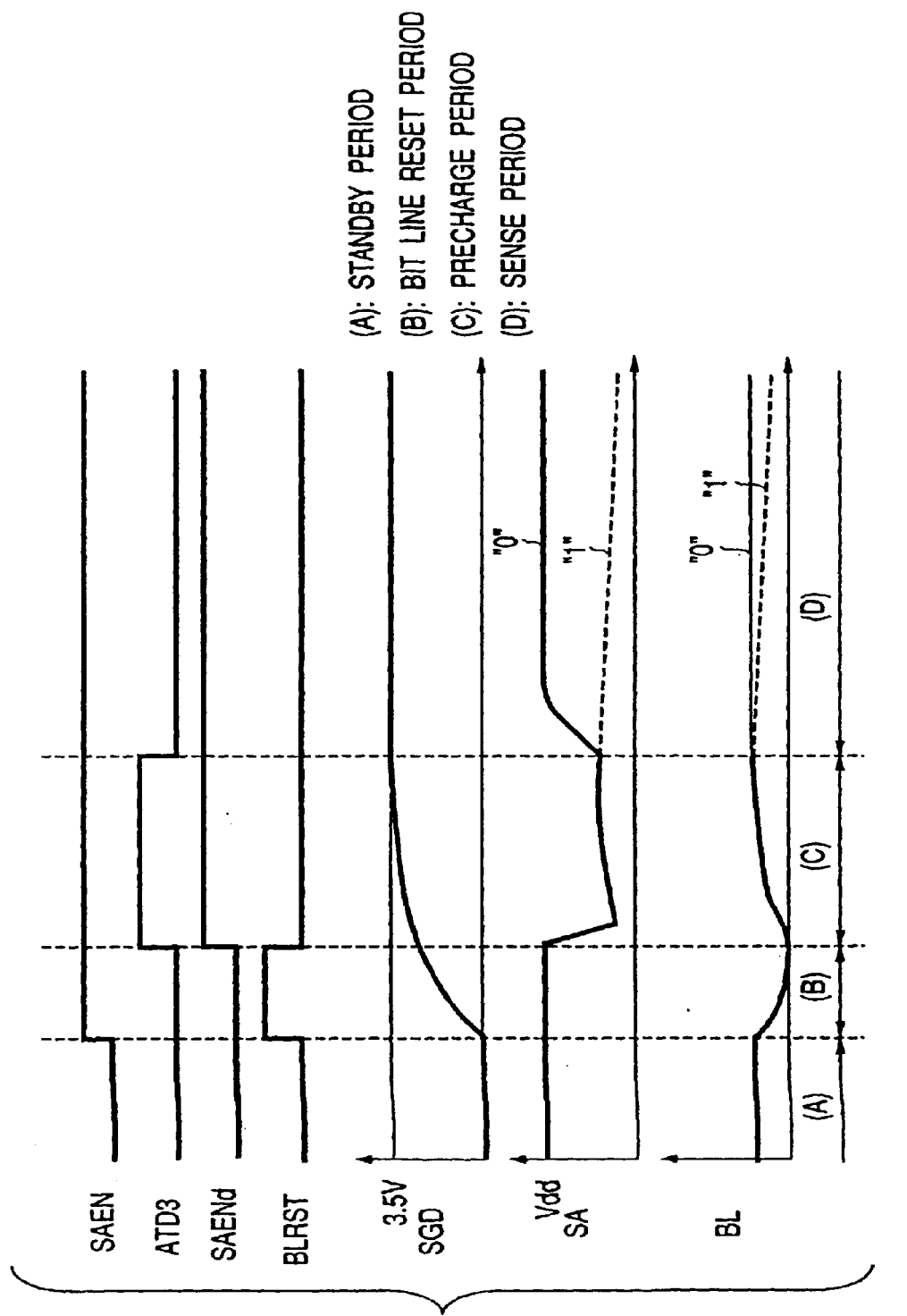
FIG. 15 is a waveform chart showing operation timings of the read circuit according to the present invention.

FIG. 15 shows timings of control signals which control the operation of the read circuit according to the present invention.

SAEN, ATD3, SAENd, BLRST in FIG. 15 correspond to SAEN, ATD3, SAENd, BLRST in FIG. 14. Also, SGD is a gate potential of a select transistor on the bit line side (potential on the select gate line).

The read operation is mainly controlled by SAEN (SAENn), ATD3 (ATD3n), SAENd, BLRST, and is segmented into four periods: (A) a standby period, (B) a bit line reset period, (C) a precharge period, and (D) a sense period.

It should be noted that the read circuit shown in FIGS. 6, 7 and 11 uses the enable signal EN in addition to the aforementioned control signals. The enable signal EN is a signal for enabling an analog circuit.

For example, a current consumed by a chip can be reduced substantially to zero by setting the enable signal to "L" (however, a current not much more than a cutoff leak of a MOS transistor will flow).

In the periods (A) to (D), EN is set to "H" (EN="H").

In the following, the operation in each period will be described in order.

2.2.1. Standby Period

The period (A) in FIG. 15 is a standby period. The standby period refers to a waiting period before a read operation is executed.

The INVSRC generating circuit 18, the VCLAMP generating circuit 20 and the SAREF precharge circuit 21 (see FIGS. 7 and 11), and the Vcgref generating circuit 24 (see FIGS. 2 and 12) are operative even in the standby period. Specifically, the control signals VCLAMP, BLREF are generated in the VCLAMP generating circuit 20 where EN is at "H." Also, the control signal Vcgref is generated in the Vcgref generating circuit 24 where ENn is at "L." Further, the control signal INVSRC is generated in the INVSRC circuit 18.

In the standby period, since SAEN is at "L," the path from the P-channel MOS transistor MP2 to the reference cell 23 (see FIGS. 7 and 11) is electrically disconnected. On the other hand, since the SAREF precharge circuit 21 (see FIGS. 7 and 11) is operative, the SAREF node 32 and the BLSREF node 35 are respectively precharged.

A precharge level (potential) at each node is set substantially equal to the potential generated at the SAREF node 32 and the potential at the BLSREF node 35 at the time SAEN transitions to "H."

The SAREF node 32 and the BLSREF node 35 have been previously precharged in the standby period in this way for purposes of reducing a time required until the potential at the SAREF node 32 and the potential at the BLSREF node 35 are established during an actual read operation, in order to increase the read speed.

Stated another way, if such a precharge operation were not performed, a quite long time would be required until the potentials at SAREF node 32 and the BLSREF node 35 are established after the SAEN has transitioned to "H," resulting in a longer read time.

Particularly, the SAREF node 32 is connected to the gate of the MOS transistor MP1 in the sense amplifier S/Ai, so that when n sense amplifiers S/A1, . . . , S/Ai, . . . , S/A·n are arranged in a chip, gates of n MOS transistors are connected to the SAREF node 32, resulting in an extremely large parasitic capacitance produced at the SAREF node 32.

Therefore, for accomplishing a high speed read, the SAREF node 32 must have been previously precharged during the standby period, to establish the potential at the SAREF node 32 during a read operation in a shorter time.

Nevertheless, since the SAREF precharge circuit 21 (see FIG. 11) causes a penetration current to flow in an operative state, the SAREF node 32 previously precharged by the SAREF precharge circuit 21 will increase a standby current (consumed current) in the standby period.

This problem, however, can be solved by a countermeasure as shown below. Specifically, the standby current can be reduced by employing the N-channel MOS transistor MN12 (see FIG. 11) of a smaller size. Also, in this event, the precharge level of the SAREF node 32 can be adjusted by the sizes of the MOS transistors MP11, MI5.

Also, when it is difficult to set the precharge level at the SAREF node 32 during the standby completely equal to the level at the SAREF node 32 during a read (SAEN="H"), the precharge level at the SAREF node 32 may be set slightly lower than the level at the SAREF node 32 during the read.

By thus setting the precharge level at the SAREF node 32, since the P-channel MOS transistor MP2 having a large driving force has been in ON state at the time SAEN transitions to "H," the SAREF node 32 is rapidly charged through the MOS transistor MP2, so that the potential at the SAREF node 32 is promptly established during the read.

When the precharge level at the SAREF node 32 is set slightly higher than the level at SAREF node 32 during a read, the P-channel MOS transistor MP2 having a larger driving force is initially in OFF state, and a charge on the SAREF node 32 is discharged through the reference cell having a smaller driving force, so that the establishment of the potential at the SAREF node 32 is delayed during the read.

2.2.2. Bit Line Reset Period

A period (B) in FIG. 15 is a bit line reset period.

In the bit line reset period, BLRST transitions to "H," causing the MOS transistors ML3, Trj to turn on (see FIG. 6). As a result, the bit line BLj and the BLS node 34 are respectively reset to the ground potential (0 V). The bit line BLj and the BLS node 34 are respectively grounded (reset) because the log of the previous read operation is eliminated when reads are repeatedly performed.

Now, referring again to FIG. 3, the necessity of resetting the bit line will be described from a viewpoint of a trouble which would occur if the bit line is not reset.

Assuming that data contained in memory cells MC1, MC2, MC3, MC4, MC5, MC6 are "0," respectively, and data contained in memory cells MC7, MC8, MC9 are "1," respectively, consider the case where data are read in the order of the memory cells MC3→MC5→MC7.

First, in a data read operation for the memory cells MC3, MC5, the bit lines BLn, BLj are respectively precharged to approximately 1 V. Also, since the data in the memory cells MC3, MC5 are "0," the memory cells (selected cells) MC3, MC5 enter into OFF state at the time of a read after precharging the bit lines BLn, BLj. Therefore, even after the data read is completed, the bit lines BLn, BLj maintain a potential of approximately 1 V.

Here, since this embodiment is not implemented on the assumption that the potentials on the bit lines BLn, BLj are reset (set to the ground potential), the next data read is executed for the memory cell MC7 with the potential of approximately 1 V maintained on the bit lines BLn, BLj and with the bit lines BLn, BLj remaining in a floating state (because the column gates corresponding to the bit lines BLn, BLj are in OFF state).

In the data read operation for the memory cell MC7, the select gate lines SGDp, SGSp are both set to approximately 3.5 V. Therefore, if the select gate lines SGDp, SGSp are respectively increased from 0 V to approximately 3.5 V, select transistors connected to the select gate lines SGDp, SGSp are all turned on. Also, if 0 V is applied to a selected word line Wp, non-selected cells MC8, MC9 are in "1" state, so that the non-selected cells MC8, MC9 connected to the word line Wp enter into ON state.

In this event, charges accumulated on the bit lines BLn, BLj are discharged to the source line SL through the non-selected cells MC8, MC9. As a result, a source potential of the selected memory cell MC7 may exceed 0 V due to a voltage drop caused by the resistances of the cell source line SL and the shunt line SH. Such a phenomenon occurs more prominently as a larger number of memory cells storing "1" data are connected to the word line Wp.

Then, as the source potential of the selected memory cell MC7 exceeds 0 V, a current flowing into the memory cell MC7 is reduced below a current which flows into the memory cell MC7 when the source potential is 0 V, thereby preventing the potential of the SA node 33 (see FIG. 6) from decreasing sufficiently, with the result that the data in the memory cell MC7 may be determined as "0" although it is "1."

In the present invention, the potentials on all the bit lines are reset (set to the ground potential) at the beginning of a read operation in order to eliminate a read error resulting from such a read history.

Also, the absence of the bit line reset period would cause useless consumption of power, as described below.

Specifically, the column gate 15 (see FIG. 3) selects a bit line based on an address signal. Therefore, as the address signal changes, a selected bit line also changes. In this event, for selecting again a bit line in response to a change in the address signal, a constant period of time is inevitably required due to the influence of a wiring delay and a logic delay.

Assuming that the bit line reset period (B) is not provided, the bit line is precharged (in the period (C)) immediately after the standby state (in the period (A)). More specifically, if precharging of the bit line is started at the same time SAEN transitions to "H," the bit line will be precharged before a selected bit line is established in the column gate.

Thus, a bit line selected by the preceding address signal is still selected until a selected bit line is established in the column gate after SAEN has transitioned to "H" to precharge a bit line which is not related to a bit line to be selected this time, with the result that the power is consumed for nothing.

To eliminate the useless power consumption, the present invention provides the bit line reset period (B). Useless power will not be consumed if the bit line reset period (B) is set in the column gate to be longer than a period required to establish a selected bit line (selected column) after SAEN has transitioned to "H."

2.2.3. Bit Line Precharge Period

A period (C) in FIG. 15 is a bit line precharge period.

In the bit line precharge period, ATD3 transitions to "H," causing the MOS transistors MP8, MN6 to turn on. Also, since the INVSRC node 31 has been previously charged (in the standby period), the potential of the control signal LCLAMP varies in accordance with the potential of the control signal BLS. When the potential of the control signal BLS is approximately at 0 V, the control signal LCLAMP is approximately at Vdd, causing the MOS transistor MI2 to turn on.

Consequently, a current flows from the Vdd node into the bit line BLj (BLS node 34) through the MOS transistor MI2 (see FIG. 6) to precharge the bit line BLj.

Also, in this event, since the MOS transistor ML1 also turns on, the SA node 33 and the BLS node 34 are short-circuited to each other to charge not only the BLS node 34 but also the SA node 33 (more exactly, since the SA node 33 is at Vdd as it is supplied with a charge from the MOS transistor MP1, the SA node 33 lowers from Vdd to the precharge level).

In the bit line precharge period, the SA node 33 and the BLS node 34 are short-circuited to each other because the precharge levels at the SA node 33 and the BLS node 34 are set to the same value which is a value lower than a threshold voltage Vsense of the inverter INV1. With the value thus set, the output potential of the inverter INV1 (potential at the N1 node) is at "H."

Specifically, since the MOS transistor MP4 in the inverter INV1 applies a current as small as approximately 6 $\mu$A for lower power consumption, the N1 node left at "L" would require an extremely long time to transition the N1 node from "L" to "H."

Thus, in the present invention, the output potential (potential at the N1 node) of the inverter INV1 has been previously set to "H," to contribute to a faster read.

The path comprising the MOS transistor MI2, the inverter INV2 and the INVSRC circuit 18 (see FIGS. 6 and 7) serves to maintain the precharge level on the bit line to a proper value.

In the following, the operation of this path will be described (see FIGS. 6 and 7).

The MOS transistor MP3 (in the inverter INV in FIG. 6) and the MOS transistor MP5 (in the INVSRC generating circuit 18 in FIG. 7) are set to have the size (channel length L and channel width W) identical to each other. The MOS transistor MN2 (in the INVSRC generating circuit 18 in FIG. 7) and the MOS transistor MN3 (in the inverter INV2 in FIG. 6) are likewise set to have the size (channel length L and channel width W) identical to each other. It can therefore be regarded that the inverter INV2 and the INVSRC circuit 18 constitute a single differential amplifier as a whole.

Input signals to this differential amplifier include the control signal BLS and the control signal BLREF, and an output signal therefrom is the control signal LCLAMP. At the time precharging of the bit line BLj has started, the control signal BLS is at 0 V, and the control signal LCLAMP is at Vdd, so that the bit line BLj is rapidly precharged through the MOS transistors MP8, MI2.

Also, when the precharged bit line BLj causes the control signal BLS (potential on the bit line) to be higher than the control signal BLREF (reference potential), the control signal LCLAMP falls from Vdd to near 0 V at this time, thereby suppressing injection of charges from the MOS transistor MI2 to the bit line.

Also, since the MOS transistor ML4 turns on simultaneously, excessive charges accumulated on the bit line BLj are discharged to the Vss node through the MOS transistor ML4.

In this way, the bit line BLj (the BLS node 34 and the SA node 33) is properly precharged to a potential (precharge level) substantially equal to the control signal BLREF (BSL=SA=BLREF).

The sizes of the MOS transistors MI2, ML4 are set such that the control signal VCLAMP is equal to the control signal LCLAMP in potential during the bit line precharge period when Icell=Iref/2 is satisfied.

For this purpose, the MOS transistors MI2, ML4 in FIG. 6 and the MOS transistors MI4, MN1 in FIG. 7 must be set to satisfy the following relation:

(WMI2/LMI2)/(WML4/LML4)=(WMI4/LMI4)/(WMN1/LMN1)

where WMI2, LMI2 represent the channel width and channel length of the MOS transistor MI2, respectively; WLM4, LML4 represent the channel width and channel length of the MOS transistor ML4, respectively; WMI4, LMI4 represent the channel width and channel length of the MOS transistor MI4, respectively; and WMN1, LMN1 represent the channel width and channel length of the MOS transistor MN1, respectively.

By setting the MOS transistors MI2, ML4 in FIG. 6 and the MOS transistors MI4, MN1 in FIG. 7 to have the channel widths and channel lengths which satisfy the relation as expressed above, the sense operation, later described, can be promptly performed.

2.2.4. Sense Period

A period (D) in FIG. 15 is a sense period.

At the time the bit line has been precharged, the control signal BLS and the control signal BLREF are substantially equal to each other (at a potential of approximately 1 V or less, however, except for zero). Also, the control signal LCLAMP is substantially equal to the control signal VCLAMP (at a potential of approximately 1.3 V or less, however, except for zero).

A difference between the control signal VCLAMP and the control signal BLREF (approximately 0.3 V) is on the order of the threshold voltage of the MOS transistor MI4. Therefore, the MOS transistor MI1 is substantially in a cut-off state (see FIGS. 6 and 7).

In this state, when ATD3 transitions to "L" and the MOS transistor ML1 turns off, the potential at the SA node 33 is determined by the current Iref/2 flowing into the MOS transistor MP1 and the cell current Icell of the memory cell M2.

When the memory cell M2 contains data "0," i.e., when the cell current Icell does not flow into the memory cell M2 at the time the selected word line Wi is applied with 0 V, the BLS node 34 has already been precharged to prevent charges from escaping. Therefore, charges supplied from the MOS transistor MP1 to the SA node 33 are all charged in the SA node 33.

Here, the SA node 33 has a capacity extremely small as compared with the capacity of the bit line BLj. In other words, if the memory cell M2 contains data "0," the SA node 33 is rapidly charged to Vdd.

As described above, in the present invention, since the bit line BLj (BLS node 34) has already been precharged, the SA node 33 is rapidly charged when the memory cell M2 contains data "0." Then, as described later, the threshold voltage (the value for determining whether data is "0" or "1") Vsense of the inverter INV1 is set to a potential higher than the precharge level of the SA node 33 (for example, at approximately 1.3 V), so that the SA node 33 rapidly charged to Vdd means that a high speed read can be performed.

On the other hand, when the memory cell M2 contains data "1," i.e., when the cell current Icell flows into the memory cell M2 at the time the selected word line Wi is applied with 0 V, the cell current Icell (=Iref) is larger than the current Iref/2 which flows into the MOS transistor MP1, so that the potential at the SA node 33 will not exceed the precharge level (a potential of approximately 1 V or less, however, except for zero), and gradually falls toward Vss (0 V).

When the memory cell M2 contains data "1," the potential at the SA node 33 slowly falls. However, since the threshold voltage Vsense of the inverter INV1 is set to a potential (for example, approximately 1.3 V) higher than the precharge level of the SA node 33, the high speed sense will not suffer from any inconvenience.

During the sense period, the inverter INV2 (see FIG. 6) is operational. In other words, in the present invention, the inverter INV2 serves to accelerate a change in potential at the SA node 33 in the sense period.

More specifically, when the memory cell M2 contains data "0," the inverter INV2 reduces the value of the control signal LCLAMP. As a result, the MOS transistor MI1 is completely cut off, so that the rising potential at the SA node 33 is accelerated.

On the other hand, when the memory cell M2 contains data "1," the inverter INV2 increases the value of the control signal LCLAMP. As a result, charges in the SA node 33 having a smaller capacity more readily flow into the BLS node 34 having a larger capacity through the MOS transistor MI1, so that the potential at the SA node 33 gradually falls while maintaining the same potential as that at the BLS node 34.

The inverter INV1 (see FIG. 6) detects a change in the potential at the SA node 33, specifically, whether the potential at the SA node 33 is "H" or "L." The inverter INV1 has the threshold value Vsense set at a larger value than the precharge level of the SA node 33 (a potential of approximately 1 V or less, however, except for zero), for example, at approximately 1.3 V.

This is because the determination as to "H"/"L" at the SA node 33 can be promptly made by setting Vsense in the foregoing manner, since the SA node 33 can be charged fast in the present invention as described above.

It should be noted that the threshold voltage Vsense of the inverter INV1 can be adjusted by coordinating the size of the MOS transistor MN4.

The MOS transistor MP4 in the inverter INV1 has a gate connected to the INVSRC node 31, rather than connected to the SA node 33 (see FIG. 6). This is because if the gate of the MOS transistor MP4 were connected to the SA node 33, the threshold voltage Vsense of the inverter INV1 would largely depend on Vdd.

Thus, the gate of the MOS transistor MP4 is connected to the INVSRC node 31 such that the threshold voltage Vsense of the inverter INV1 does not depend on Vdd. Consequently, the threshold voltage Vsense of the inverter INV1 is determined by the current source I1 of the VCLAMP generating circuit 20 and a current flowing into the MOS transistor MN4.

In FIGS. 6 and 7, the MOS transistors MP3, MP4, MP5 are equal in size to one another, and the MOS transistors MN1, MN2 are also equal in size to each other. For this reason, currents flowing into the inverters INV1, INV2 are both equal to a current generated by the current source I1 in the VCLAMP generating circuit 20 (for example, approximately 6 $\mu$A).

Therefore, according to the read circuit of the present invention, a current consumed in one sense amplifier S/Ai (except for Icell) for sensing data (in the sense period) is equal to the total value of the currents flowing into the inverters INV1, INV2 (approximately 12 $\mu$A).

This value is one quarter or less of a current (approximately 50 $\mu$A) consumed by a differential amplifier in one sense amplifier within the conventional read circuit (see FIG. 1). In other words, the present invention can contribute to a reduction in power consumption as well as to a high speed read.

It should be noted that the inverter INV1 is designed such that the MOS transistor MP4 is applied only with a current of approximately 6 $\mu$A for reducing the power consumption as described above. For this reason, it takes quite a long time to charge the N1 node to "H" level.

To cope with this inconvenience, the potential at the SA node 33 is set to a potential equal to or less than the threshold voltage Vsense of the inverter INV1 (a potential of approximately 1 V or less, however, except for zero) in the precharge period (C), as described above. Specifically, the potential at the N1 node has been previously set at "H" level and is discharged to "L" level when the memory cell M2 contains data "0."

The MOS transistors MI3, MI4 in FIG. 7 are sized such that the control signal VCLAMP is equal in potential to the control signal LCLAMP during the sense period when Icell=Iref/2.

For such sizing, the MOS transistors MI3, MI4 must be set to have the following relation:

$$(WMI3/LMI3)/Iref=(WMI4/LMI4)/ISRC$$

where WMI3, LMI3 represent the channel width and channel length of the MOS transistor MI3, respectively; WMI4, LMI4 represent the channel width and channel length of the MOS transistor MI4, respectively; and ISRC represents a current generated by the current source I1 (approximately 6 $\mu$A).

As described above, the respective transistors are sized such that the control signal VCLAMP is equal in potential to the control signal LCLAMP during the bit line precharge period as well. This permits a smooth transition from the precharge period to the sense period without causing a sudden change in the potential of the control signal LCLAMP, thereby making it possible to promptly perform a sense operation.

2.2.5. Summary

The operation of the read circuit according to the present invention has been described above in detail. Now, the features of the read operation in the present invention are summarized as follows (see FIGS. 6, 7 and 11).

[About Reduction in Power Consumption]

(i) Since the potential at the SA node 33 widely changes, a change in potential on the bit line need not be detected by a differential amplifier, so that a consumed current can be largely reduced.

(ii) The currents flowing into the inverters INV1, INV2 are so small (approximately 6 $\mu$A) that a very small current is consumed during a read.

(iii) Since a selected bit line can be established during the bit line reset period, no current is consumed while the bit line is precharged.

[About Faster Read]

(i) Since the INVSRC node 31 has been previously charged in the standby period, the bit line (BLS node 34 and SA node 33) is precharged more rapidly.

(ii) Since the SA node 33 has a capacity significantly smaller than that of the bit line, and the bit line has been precharged, the SA node 33 can be rapidly charged for reading "0."

(iii) Since the SAREF node 32 has been previously charged in the standby period, the SA node 33 can be rapidly charged for reading "0."

(iv) Since the control signal LCLAMP is reduced approximately to 0 V, when the control signal BLS is at the precharge level, to completely cut off the MOS transistor MI1, the charging of the SA node 33 is accelerated.

(v) Since Vsense is higher than the precharge level of the bit line, a change in the potential at the SA node 33 can be promptly sensed by virtue of (ii) through (vi).

(vi) Since the NI node has been previously charged to Vdd, data can be promptly discriminated even with the small MOS transistor MP4.

[Others]

(i) The employment of constant current circuits (the VCLAMP generating circuit 20 and the INVSRC generating circuit) eliminates the Vdd dependency of the inverters (sense circuits) INV1, INV2.

(ii) Since a sequence for resetting the potential on the bit line is added, a read error due to a read history can be prevented.

(iii) While the bit line is being precharged, the control signal LCLAMP is increased to approximately Vdd when the control signal BLS is below the precharge level, and the control signal LCLAMP is reduced to approximately 0 V and the MOS transistor ML4 turns on as the control signal BLS exceeds the precharge level, so that the potentials of the control signals BLS, SA can be accurately set to the precharge level.

3. Modifications to Read Circuit

While the basic configuration of the main components in the read circuit according to the present invention has been shown in FIGS. 6, 7 and 11, the present invention is not limited to this configuration and can of course be modified in various manners without departing from the spirit and scope of the invention.

In the following, description will be made on modifications which appear to be highly feasible and important.

3.1. Modification 1

Figure 16:
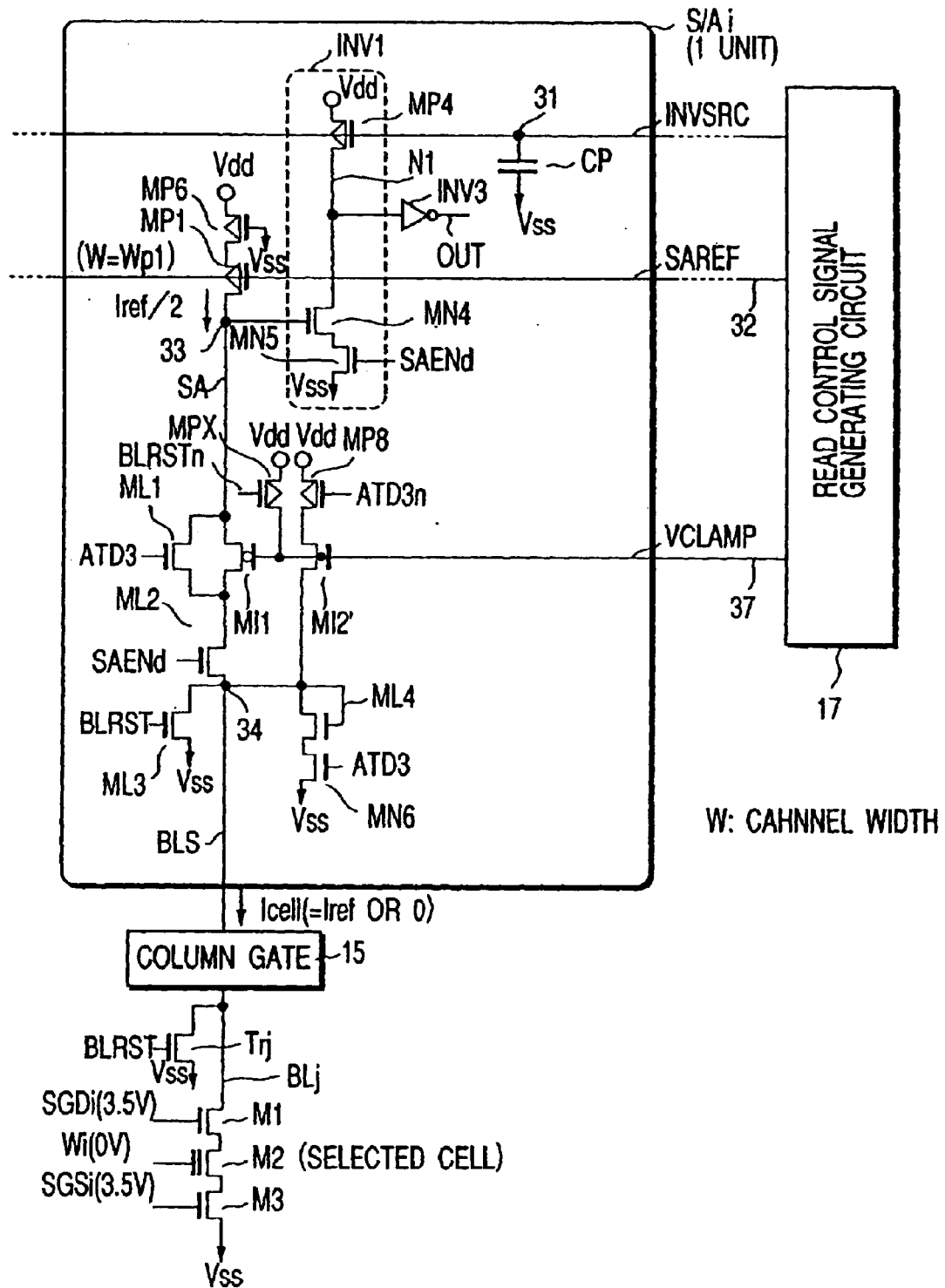
FIG. 16 is a diagram showing a sense amplifier.

FIGS. 16 and 17 show main components of a read circuit according to the present invention.

This read circuit is characterized by the configuration of a precharge circuit for use in precharging and sensing the bit line BLj, as compared with the read circuit shown in FIGS. 6 and 7.

Specifically, in this modification, the sense amplifier S/Ai excludes the inverter INV2 as shown in FIG. 6. More specifically, the VCLAMP node 37 is connected directly to gates of MOS transistors MI1, MI2'.

In this configuration, as ATD3 transitions to "H" (in the bit line precharge period), the bit line BLj (BLS node 34 and SA node 33) is supplied with charges from the MOS transistor MI2' to precharge the bit line BLj. The precharge level is determined by Vdd, the diode-connected MOS transistor ML4, and the like.

In the read circuit of this modification, since a constant potential is maintained at a gate of the MOS transistor MI2' at all times, the MOS transistor MI2' must be large in size (channel width W) for providing a precharge time as short as that of the read circuit shown in FIGS. 6 and 7.

The read circuit of this modification is advantageous over the read circuit of FIGS. 6 and 7 in that a current consumed for a read is reduced by the amount consumed by the inverter INV2 shown in FIG. 6.

3.2. Modification 2

Figure 18:
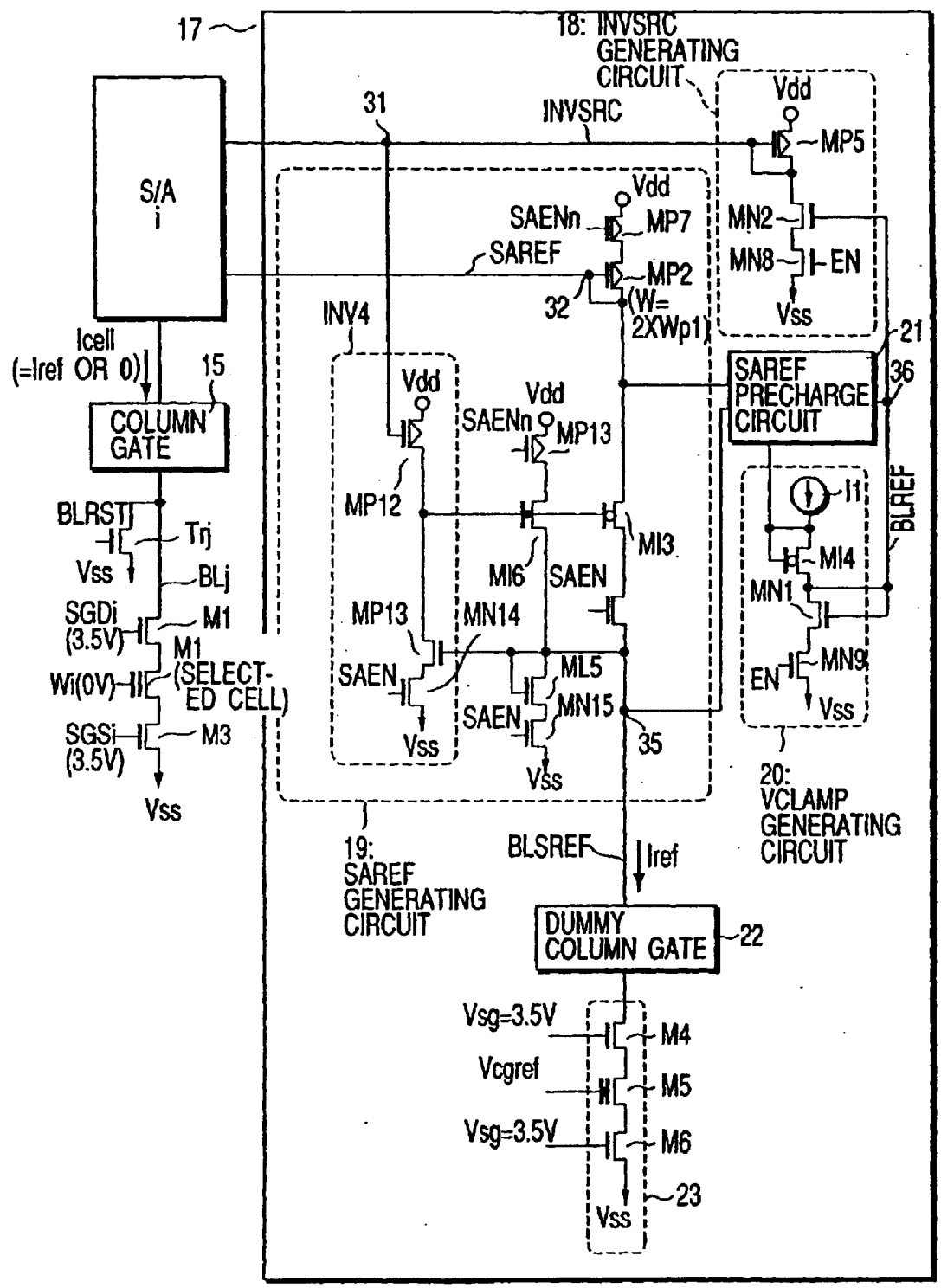
FIG. 18 is a diagram showing a read control signal generating circuit.

FIG. 18 shows main components of a read circuit according to the present invention.

In comparison with the read circuit of FIGS. 6 and 7, this read circuit is characterized in that the potential at the gate of the MOS transistor MI3 in the SAREF generating circuit 19 is generated by a mechanism similar to the inverter INV2 in FIG. 6.

Specifically, an inverter INV4 corresponds to the inverter INV2 in FIG. 6, and a charging circuit (comprised of MOS transistors MP13, MI6, ML5, MN15) corresponds to the precharge circuit (comprised of MOS transistors MP8, MI2, ML4, MN6) in FIG. 6.

The sense amplifier S/Ai of the read circuit shown in FIG. 18 is identical in internal configuration to the sense amplifier S/Ai shown in FIG. 6.

With the configuration described above, since a circuit for generating the potential at the gate of the MOS transistor MI1 (see FIG. 6) has completely the same configuration as a circuit for generating the potential at the gate of the MOS transistor MI3, good circuit symmetry, as it is called, is provided, thereby allowing an accurate comparison of a cell current of the memory cell M2 with a reference cell current of the reference cell M5.

3.3. Application Example of Present Precharge Scheme to Other Read Circuits

The precharge scheme used in the read circuit of the present invention per se has a novel configuration and remarkable advantages, separate from the read circuit of the present invention which employs no differential amplifier in the sense amplifier, and can of course be applied to read circuits other than the read circuit of the present invention.

Specifically, taking the read circuit of FIGS. 6 and 7 as an example, only a combination of the INVSRC circuit 18, the inverter INV2 and the precharge circuit (comprised of the MOS transistors MP8, MI2, ML4, MN6) is regarded as a separate invention related to a precharge scheme.

This precharge scheme is characterized, as previously described, in that (i) more rapid precharging is accomplished by previously charging the INVSRC node 31; and (ii) the precharge level (potential at the BLS node 34) can be accurately set to the control signal BLREF without depending on Vdd.

FIG. 19 shows an example in which the precharge scheme of the present invention is applied to the conventional read circuit (FIG. 1).

In this example, the precharge scheme of the present invention is used to precharge a BL node and a RBL node.

The INVSRC generating circuit 18 in FIG. 19 is completely the same as the INVSRC generating circuit 18 in FIG. 7. The control signal BLREF is an intermediate potential generated by the VCLAMP generating circuit 20 in FIG. 7. The inverters INV5, INV6 are completely the same as the inverter circuits INV2 in FIG. 6. A precharge circuit (comprised of MOS transistors MP22, MN23 to MN25 and MOS transistors MP24, MN29 to MN31) corresponds to the precharge circuit (comprised of MOS transistors MP8, MI2, ML4, MN6) in FIG. 6.

The INVSRC node 31 is previously charged in a standby period. Subsequently, when a bit line precharge period is entered, SAEN transitions to "H" and ATD to "H" to execute a precharge operation for precharging the BL node and the RBL node. This precharge operation is completely the same as the bit line precharge operation in the read circuit of FIGS. 6 and 7.

Briefly, upon precharging, the MOS transistors MN23, MN26, MN29, MN32 all turn on, so that the BL (RBL) node and the SA (RSA) node are both charged to a precharge level. As the potentials at the BL (RBL) node and the SA (RSA) node exceed the precharge level, the MOS transistors MN23, MN26, MN29, MN32 turn off, and excessive charges in the BL (RBL) node and the SA (RSA) node are discharged by the MOS transistors MN24, MN30.

In this way, the potentials at the BL (RBL) node and the SA (RSA) node are set exactly at the value equal to the potential at the BLREF node 36. In other words, the precharge level can be freely set by adjusting the value of the control signal BLREF (reference potential).

Subsequently, as a sense period is entered, SAEN transitions to "H" and ATD to "L" to start a sense operation.

Since a threshold voltage of the reference cell is identical to the threshold voltage of "1"-programming cell, a cell current Iref (=Icell) flows into the reference cell, and Iref/2 flows into a MOS transistor MN34 by a current mirror circuit.

On the other hand, when a memory cell contains data "0," the cell current Icell (=Iref) will not flow thereinto, so that the potential at the SA node 33 becomes higher than the potential at the RSA node 33. On the other hand, when the memory cell contains data "1," the cell current Icell (=Iref) flows into the memory cell, causing the potential at the SA node 33 to be lower than the potential at the RSA node 33.

Then, a differential amplifier DA amplifies a potential difference between the potential at the SA node 33 and the potential at the RSA node 33, and senses data in the memory cell.

In this way, the precharge scheme of the present invention can also be applied to the conventional read circuit.

3.4. Others

As described above, the present invention features in the read circuit or the precharge circuit which forms part of the read circuit. Also, the Vcgref generating circuit and the VCLAMP generating circuit may also be applied to circuits other than the read circuit of the present invention. Further, while the foregoing description on the read circuit of the present invention has been premised on the 3Tr-NAND configuration, the present invention can be applied to non-volatile semiconductor memories such as EEPROM, NOR cell type flash memory, and the like, as a matter of course.

4. Threshold Voltage Measuring Mode

A test mode for measuring a distribution of threshold voltage of a memory cell after write/erasure is required for optimizing conditions for a write into and an erasure from the memory cell, and for acquiring data related to the reliability such as the data holding capability.

The read scheme of the present invention can also be applied to a measurement of the threshold voltage of the memory cell in such a threshold voltage measuring mode.

In the following, description will be made on a threshold voltage measuring method according to the present invention.

First, assume that a cell current Icell is proportional to a difference between a voltage on a word line and a threshold voltage of a memory cell.

$$Icell \propto Vcg - Vtcell$$

If a sufficiently long sense period is provided, the potential at the SA node 33 in FIG. 6 transitions to "H" when:

$$V_{tcell} > V_{cg} - \frac{1}{2}\frac{C1+C2}{C1}(V_{cgref} - V_{tref})$$

and to "L" when:

$$V_{tcell} < V_{cg} - \frac{1}{2}\frac{C1+C2}{C1}(V_{cgref} - V_{tref})$$

from the aforementioned equation (2) which has been described at the beginning of "Detailed Description of the Embodiments."

In the above equations, Vtref is a threshold voltage of the reference cell M5; Vcg is a potential at the control gate of the memory cell M2; Vtcell is a threshold voltage of the memory cell M2; C1 is a capacitance between the control gate electrode and the floating gate electrode of the memory cell M2; and C2 is a capacitance between the floating gate electrode and the channel of the memory cell M2.

Here, "½" appearing in the above equations (4) and (5) is derived from the fact that the ratio of currents flowing into the MOS transistors MP1, MP2 in FIG. 6 is 1:2. Also, the values on the right sides of the above equations (4) and (5) vary depending on the values of the potential Vcg at the control gate of the memory cell and the potential Vcgref at the control gate of the reference cell. Stated another way, as the level at the SA node 33 ("H" or "L") is detected to find a change-over point of "H"/"L" at the SA node 33, while changing the values of the control gate potentials Vcg, Vcgref, the change-over point can be monitored as the threshold voltage Vtref of the memory cell.

A specific example will be described in connection with monitoring of positive/negative threshold voltages.

Monitoring of Positive Threshold Voltage

The positive threshold voltage is monitored, for example, when the threshold voltage of the memory cell is monitored after a write ("0"-programming). In this case, the potential Vcgref at the control gate of the reference cell is set to the same value as the value for a normal read, while the value of the potential Vcg at the control gate of the memory cell is gradually increased from 0 V. As the potential Vcg is increased, the potential level at the SA node 33 switches from "H" to "L" at a certain boundary point. The value of Vcg at this switching point may be substituted into the aforementioned equation (2) to derive the threshold voltage Vtcell of the memory cell.

Also, for freely switching the value of the potential Vcg at the control gate of the memory cell, a zero or a positive potential is applied as the potential Vcg at the control gate of the memory cell, for example, from an external pad for testing which may be connected to the word line. In the test mode for monitoring the positive threshold voltage, a path for grounding the word line is left shut off.

Monitoring of Negative Threshold Voltage

The negative threshold voltage is monitored, for example, when the threshold voltage of the memory cell is monitored after an erasure. In this case, the value of the potential Vcg at the control gate of the memory cell is fixed at 0 V, while the value of the potential Vcgref at the control gate of the reference cell is gradually increased from the value for a normal read. As the potential Vcgref is increased, the potential level at the SA node 33 switches from "L" to "H" at a certain boundary point. The value of Vcgref at this switching point may be substituted into the aforementioned equation (2) to derive the threshold voltage Vtcell of the memory cell.

Also, for freely switching the value of the potential Vcgref at the control gate of the reference cell, a zero or a positive potential is applied as the potential Vcgref at the control gate of the reference cell, for example, from the external pad for testing which may be connected to the Vcgref node. The potential Vcgref at the control gate of the reference cell in the test mode may be varied by using a trimming function of the Vcgref generating circuit.

With the employment of the approach as described, a current state of the threshold voltage Vtcell of the memory cell can be accurately measured in a range from a positive high threshold voltage to a negative low threshold voltage. Also, a threshold voltage near the boundary of the positive and negative domains (near 0 V) can also be measured accurately by using either of the two monitoring methods.

Also, the monitoring of the threshold voltage of the memory cell is not limited to the foregoing two monitoring method. Alternatively, in the two monitoring methods, the potential Vcg at the control gate of the memory cell and the potential Vcgref at the control gate of the reference cell may be gradually reduced from initial potentials, by way of example. Further alternatively, the threshold voltage of the memory cell may be monitored while varying both the potential Vcg at the control gate of the memory cell and the potential Vcgref at the control gate of the reference cell.

It should be noted that in a NOR cell type flash memory, no select transistors are generally connected between a memory cell and a bit line, but the memory cell is directly connected to the bit line. In this case, the method described in the foregoing "Monitoring of Negative Threshold Voltage" cannot be employed for monitoring the threshold voltage of the memory cell.

This is because all word lines are set at 0 V when a negative threshold voltage is monitored (i.e., Vcg=0 V). In this event, in the 3Tr-NAND configuration, one memory cell (selected cell) can be identified for connection to a bit line by means of select transistors, whereas the NOR cell type flash memory has no select transistors so that all memory cells end up in a selected state.

To avoid this situation, for example, a selected word line may be applied with 0 V, while non-selected word lines may be applied with a negative potential for maintaining associated memory cells in OFF state at all times, in which case, however, a circuit is required for generating the negative potential.

In the NOR cell type flash memory, if the write ("1"-programming) state and the erasure ("0"-programming) state are both set to a positive threshold voltage, the monitoring is only required for the positive threshold voltage, so that it can be thought that the need for monitoring the negative threshold is not so high.

5. Effects

As described above, the nonvolatile semiconductor memory according to the present invention provides the following effects.

(i) A current consumed during a read can be reduced.

Specifically, in the present invention, a change in the potential at the SA node 33 is so large that a change in a potential on the bit line need not be detected by a differential amplifier, thereby making it possible to largely reduce a consumed current. Also, since currents flowing into the inverters INV1, INV2 are quite small (approximately 6 µA), the current consumed thereby during a read is significantly reduced. Further, since a selected bit line can be established during the bit line reset period, no useless current is consumed for precharging the bit line.

(ii) A read speed can be improved.

Specifically, since the INVSRC node 31 has been previously charged in the standby period, the bit line (BLS node 34 and SA node 33) is precharged at a higher speed. Also, since the SA node 33 has a capacity significantly smaller than that of the bit line, and the bit line has been precharged, the SA node 33 can be rapidly charged when "0" is read. Further, since the SAREF node 32 has been previously charged in the standby period, the SA node 33 can be rapidly charged when "0" is read.

Also, when the control signal BLS is at the precharge level, the control signal LCLAMP is approximately at 0 V, and the MOS transistor MI1 is completely cut off, resulting in accelerated charging of the SA node 33. Further, since Vsense is higher than the precharge level of the bit line, a change in the potential at the SA node 33 can be promptly sensed. Furthermore, since the N1 node is previously charged to Vdd, the data can be promptly discriminated even if the MOS transistor MP4 is small in size.

(iii) The employment of the constant current circuits (VCLAMP generating circuit 20 and INVSRC generating circuit) eliminates the dependency of the inverters (sense circuits) INV1, INV2 on Vdd.

(iv) The addition of a sequence for resetting the potential on the bit line results in the ability of preventing a read error due to read history.

(i) For precharging the bit line, the control signal LCLAMP is increased substantially to Vdd when the control signal BLS is below the precharge level. Then, the control signal LCLAMP is reduced substantially to 0 V and the MOS transistor ML4 turns on as the control signal LBS exceeds the precharge level. Therefore, the potentials of the control signals BLS, SA can be accurately set to the precharge level.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A read circuit of a nonvolatile semiconductor memory comprising:

at least one sense amplifier; and a read control signal generating circuit for supplying a first signal to said at least one sense amplifier, wherein said at least one sense amplifier has a first current path comprised of a first P-channel MOS transistor having a source electrically connected to a first power supply node and a gate applied with said first signal, and a first N-channel MOS transistor connected between a drain of said first P-channel MOS transistor and a memory cell and having a gate applied with a second signal, and said read control signal generating circuit has a second current path comprised of a second P-channel MOS transistor having a gate and a drain connected to the gate of said first P-channel MOS transistor and a source electrically connected to said first power supply node, and a second N-channel MOS transistor connected between the drain of said second P-channel MOS transistor and a reference cell and having a gate applied with said second signal.

2. The read circuit according to claim 1, wherein assuming that a write state is defined as a state in which a difference (Vcg–Vtcell) between a voltage Vcg at a control gate of said memory cell and a threshold voltage Vtcell is negative, and an erasure state is defined as a state in which said difference is positive, the sizes of said first and second P-channel MOS transistors and the value of a cell current of said reference cell are determined such that a drain current of said first P-channel MOS transistor is smaller than a cell current of said memory cell when said memory cell is in the erasure state.

3. The read circuit according to claim 2, wherein said first and second P-channel MOS transistors are sized in a ratio such that the value of the cell current of said reference cell is equal to the value of the cell current of said memory cell when said memory cell is in the erasure state, and the value of the drain current of said first P-channel MOS transistor is one half of the value of the cell current of said reference cell.

4. The read circuit according to claim 1, wherein assuming that the number of said at least one sense amplifier is N, where N is a natural number, the number of said first P-channel MOS transistors is N, and said reference cell comprises M cells connected in parallel with each other, where M is a natural number and satisfies M>N/4.

5. The read circuit according to claim 1, wherein said reference cell has the same structure as a structure obtained by short-circuiting a control gate electrode to a floating gate electrode of said memory cell.

6. The read circuit according to claim 5, wherein a potential applied to a control gate electrode of said reference cell is set to a value such that a cell current of said reference cell is substantially equal to a cell current of said memory cell in an erasure state.

7. The read circuit according to claim 1, wherein for monitoring a threshold voltage of said memory cell having a negative threshold voltage in a test operation, a potential at a control gate electrode of said memory cell is fixed to a value for a normal read operation, and a potential at a control gate electrode of said reference cell is varied to detect the threshold voltage of said memory cell; and for monitoring a threshold voltage of said memory cell having a positive threshold voltage, the potential at the control gate electrode of said reference cell is fixed to the value for the normal read operation, and a potential at the control gate electrode of said memory cell is varied to detect the threshold voltage of said memory cell.

8. The read circuit according to claim 1, wherein said at least one sense amplifier includes an inverter which functions as a sense circuit;

said inverter is comprised of a third P-channel MOS transistor having a gate applied with a fourth signal, a source connected to said first power supply node, and a drain connected to an output node; and a third N-channel MOS transistor having a gate connected to a connection node between said first P-channel MOS transistor and said first N-channel MOS transistor, a source connected to a second power supply node, and a drain connected to said output node; and said inverter discriminates data in said memory cell by detecting a change in a potential at said connection node.

9. The read circuit according to claim 8, wherein said connection node is precharged to a potential lower than a threshold voltage of said inverter before a sense operation.

10. The read circuit according to claim 1, wherein said read control signal generating circuit includes a precharge circuit, said precharge circuit precharging a first connection node between said second P-channel MOS transistor and said second N-channel MOS transistor, and a second connection node between said second N-channel MOS transistor and said reference cell, respectively, for a period other than a first period in which a cell current is flowing into said reference cell.

11. The read circuit according to claim 10, wherein a potential at said first connection node in a second period is set to a value identical to or lower than the potential at said first connection node in said first period, and a potential at said second connection node in said second period is set to a value identical to or lower than the potential at said second connection node in said first period.

12. The read circuit according to claim 1, wherein said at least one sense amplifier includes an N-channel MOS transistor which is connected in parallel with said first N-channel MOS transistor, and transitions to an ON state when a bit line is precharged.

13. The read circuit according to claim 1, wherein a potential on a bit line is reset before said bit line is precharged.

14. The read circuit according to claim 13, wherein a precharge period is provided for said bit line subsequent to a reset period for said bit line, said bit line being selected in the reset period of said bit line.

15. The read circuit according to claim 13, wherein the gate of said first N-channel MOS transistor is connected to said first power supply node when said bit line is precharged.

* * * * *